US007215787B2

(12) United States Patent
Sternad et al.

(10) Patent No.: US 7,215,787 B2
(45) Date of Patent: May 8, 2007

(54) DIGITAL AUDIO PRECOMPENSATION

(75) Inventors: Mikael Sternad, Uppsala (SE); Anders Ahlen, Knivsta (SE)

(73) Assignee: Dirac Research AB, Uppsala (SE)

( * ) Notice: Subject to any disclaimer, the term of this patent is extended or adjusted under 35 U.S.C. 154(b) by 850 days.

(21) Appl. No.: 10/123,318

(22) Filed: Apr. 17, 2002

(65) Prior Publication Data

US 2004/0125487 A9 Jul. 1, 2004

(51) Int. Cl.
*H03G 5/00* (2006.01)

(52) U.S. Cl. ........................................ 381/98; 381/103

(58) Field of Classification Search ................ 381/103, 381/98, 101, 102, 107, 108, 94.3, 9, 66, 93, 381/71.1, 71.8, 78.9, 71.11, 71.12
See application file for complete search history.

(56) References Cited

U.S. PATENT DOCUMENTS 5,600,718 A 2/1997 Dent et al.
5,680,450 A * 10/1997 Dent et al. ............. 379/406.08
6,519,344 B1 * 2/2003 Yajima et al. .............. 381/103
6,697,492 B1 * 2/2004 Yamaguchi et al. ........ 381/103
6,928,172 B2 * 8/2005 Ohta ........................... 381/98

FOREIGN PATENT DOCUMENTS

JP 08-079880 3/1996
WO WO 94/24835 10/1994

OTHER PUBLICATIONS

P.M. Clarkson et al., "Spectral, Phase, and Transient Equalization for Audio Systems", J. Audio Engineering Society, vol. 33, 1985, pp. 127-131.

P. A. Nelson et al., "Adaptive Inverse Filters for Stereophonic Sound Reproduction", IEEE Transactions on Signal Processing, vol. 40, 1992, pp. 1621-1632.

P.A. Nelson et al., "Multichannel Signal Processing Techniques in the Reproduction of Sound", J. Audio Engineering Society, vol. 44, 1996, pp. 973-989.

P.A. Nelson et al., "Inverse Filter Design and Equalization Zones in Multichannel Sound Reproduction", IEEE Transactions on Speech and Audio Processing, vol. 3, 1995, pp. 185-192.

(Continued)

*Primary Examiner*—Sinh Tran
*Assistant Examiner*—Andrew C Flanders
(74) *Attorney, Agent, or Firm*—Young & Thompson

(57) ABSTRACT

The invention concerns digital audio precompensation, and particularly the design of digital precompensation filters. The invention proposes an audio precompensation filter design scheme that uses a novel class of design criteria. Briefly, filter parameters are determined based on a weighting between, on one hand, approximating the precompensation filter to a fixed, non-zero filter component and, on the other hand, approximating the precompensated model response to a reference system response. For design purposes, the precompensation filter is preferably regarded as being additively decomposed into a fixed, non-zero component and an adjustable compensator component. The fixed component is normally configured by the filter designer, whereas the adjustable compensator component is determined by optimizing a criterion function involving the above weighting. The weighting can be made frequency- and/or channel-dependent to provide a very powerful tool for effectively controlling the extent and amount of compensation to be performed in different frequency regions and/or in different channels.

40 Claims, 14 Drawing Sheets

OTHER PUBLICATIONS

B. Widrow and S.D. Stearns, "Adaptive Signal Processing", Prentice-Hall.

S. Haykin, "Adaptive Filter Theory", 3rd Ed. Prentice-Hall, Englewood Cliffs, NJ.

S.T. Neely and J.B. Allen, "Invertibility of a room impulse response", J. Acoustical Society of America, vol. 66, 1979, pp. 165-169.

M. Sternad, M. Johansson and J. Rustrom, "Inversion of Loudspeaker Dynamics by Polynomial LQ Feedforward Control", IFAC Symposium on Robust Control Design, Prague, Czech Republic, Jun. 21-23, 2000.

M. Sternad and T. Soderstrom, "LQG-optimal Feedforward Regulators", Automatica, vol. 24, 1988, pp. 557-561.

M. Sternad and A. Ahlen, "LQ controller design and self-tuning control", Chapter 3 of K.E. Hunt, ed. Polynomial Methods in Optimal Control and Filtering, Control Engineering Series, Peter Peregrinus, London.

H.W. Strube, "Linear prediction on a warped frequency scale", J. Acoustical Society of America, vol. 68, 1980, pp. 1071-1076.

B.A. Francis, "Lecture Notes in Control and Informaiton Sciences", Springer-Verlag, Berlin.

K.J. Astrom and B. Wittenmark, "Computer-Controlled Systems", 3rd ed. Prentice-Hall, Englewood Cliffs, NJ.

A. Ahlen and M. Sternad, "Wiener Filter Design Using Polynomial Equations", IEEE Transactions on Signal Processing, vol. 39, 1991, pp. 2387-2399.

V. Kucera, Analysis and Design of Linear Control Systems, Academia, Prague and Prentice-Hall International, London.

H.W. Bode and C.E. Shannon, "A Simplified Derivation of Linear Least Square Smoothing and Prediction Theory", Proceedings of the I.R.E., vol. 38, 1950, pp. 417-425.

A. Ahlen and M. Sternad, "Derivation and Design of Wiener Filters using Polynomial Equations", in C.T. Lenondes ed. Control and Dynamic Systems, Digital Signal Processing and Applications, Academic Press, New York.

B.D.O. Anderson and J.B. Moore, "Optimal Control. Linear Quadratic Methods", Prentice-Hall International, London.

M. Sternad and A. Ahlens, "A Novel Derivation Methodology for Polynomial-LQ controller Design", IEEE Transactions on Automatic Control, vol. 38, 1993, pp. 116-121.

* cited by examiner

DIGITAL AUDIO PRECOMPENSATION

TECHNICAL FIELD OF THE INVENTION

The present invention generally concerns digital audio precompensation, and more particularly the design of a digital precompensation filter that generates one or several input signals to a sound generating system, with the aim of modifying the dynamic response of the compensated system.

BACKGROUND OF THE INVENTION

A system for generating or reproducing sound, including amplifiers, cables and loudspeakers, will always affect the spectral properties of the sound, often in unwanted ways. The reverberation of the room where the equipment is placed adds further modifications. Sound reproduction with very high quality can be attained by using matched sets of cables, amplifiers and loudspeakers of the highest quality, but this is cumbersome and very expensive. The increasing computational power of PCs and digital signal processors has introduced new possibilities for modifying the characteristics of a sound generating or sound reproducing system. The dynamic properties of the sound generating system may be measured and modeled by recording its response to known test signals, as well known from the literature. A precompensation filter, R in FIG. 1, is then placed between the original sound source and the audio equipment. The filter is calculated and implemented to compensate for the measured properties of the sound generating system, symbolized by H in FIG. 1. In particular, it is desirable that the phase and amplitude response of the compensated system is close to a prespecified ideal response, symbolized by D in FIG. 1. In other words, it is thus required that the compensated sound reproduction y(t) matches the ideal $y_{ref}(t)$ to some given degree of accuracy. The pre-distortion generated by the precompensator R cancels the distortion due to the system H, such that the resulting sound reproduction has the sound characteristic of D. Up to the physical limits of the system, it is thus, at least in theory, possible to attain a superior sound quality, without the high cost of using extreme high-end audio equipment. The aim of the design could, for example, be to cancel acoustic resonances caused by imperfectly built loudspeaker cabinets. Another application could be to minimize low-frequency resonances due to the room acoustics, in different places of the listening room.

Digital precompensation filters can be applied not only to a single loudspeaker but also to multichannel sound generating systems. They can be important elements of designs aimed not only to generate better sound, but also to produce specific effects. The generation of virtual sound sources, rendering of sound, is of interest in, for example, the audio effects of computer games.

There has since a long time existed equipment, called graphical equalizers, aimed at compensating the frequency response of a sound generating system by modifying its gains in a set of fixed frequency bands. Automatic schemes exist that adjust such filters, see e.g. [1]. There are also other prior art techniques that partition the audio frequency range into different frequency bands, and construct different compensators within each of these bands, see e.g. [2, 3]. Such sub-band solutions will suffer from inadequate phase compensation, which creates problems, in particular at the borders of the bands.

Methods that treat the audio frequency range of interest as one band, have been suggested. This requires the use and adjustment of filters with a very high number of adjustable coefficients. Proposed methods are in general based on the adjustment of FIR (Finite Impulse Response) filters to minimize a least squares criterion that measures the deviation between the compensated signal y(t) and the desired response $y_{ref}(t)$. See e.g. [4–10]. This formulation has been considered attractive since there exist tractable adaptation algorithms, as well as off-line design algorithms, that can adjust FIR filters based on least squares criteria. There also exist proposals for non-linear compensators, see e.g. [11]. Solutions, which suggest separate measurements of the room acoustics response and the loudspeaker response, have also been used in the design of a precompensation inverse filter for sound reproduction systems [3, 12]. This design partly equalizes both responses. In [13] a method is disclosed that apply both FIR and IIR (Infinite Impulse Response) filters in audio system compensation. Such an approach is used to reduce the required number of FIR filter parameters in the compensation filter. However, all these present methods suffer from significant difficulties, which make their practical use quite problematic. The design schemes available in prior art generally result in compensation filters that have a high computational complexity and severe practical limitations. The resulting automatically generated compensation filters are sometimes even dangerous to the audio equipment, due to the risk of generating compensation signals with too high power.

SUMMARY OF THE INVENTION

Design techniques and convenient tools for avoiding these drawbacks are thus needed. The present invention overcomes the difficulties encountered in the prior art.

It is a general objective of the present invention to provide an improved design scheme for audio precompensation filters.

It is another object of the invention to provide a flexible, but still very accurate way of designing such filters, allowing better control of the extent and amount of compensation to be performed by the precompensation filter. In this respect, it is particularly desirable to provide a filter adjustment technique that gives fall control over the amount of compensation performed in different frequency regions and/or in different audio channels.

It is also an object of the invention to provide a design method and system for audio precompensators that provide a good compensation performance while using a limited number of filter parameters that can easily be handled by the technology of today.

Yet another object of the invention is to provide a flexible and efficient method, system and computer program for designing a digital audio precompensation filter.

These and other objects are met by the invention as defined by the accompanying patent claims.

The present invention is based on the recognition that mathematical models of dynamic systems, and model-based optimization of digital precompensation filters, provide powerful tools for designing filters that improve the performance of various types of audio equipment by modifying the input signals to the equipment.

The general idea according to the invention is to provide an audio precompensation filter design scheme that uses a novel class of design criteria. In essence, filter parameters are determined based on a weighting between, on one hand, approximating the precompensation filter to a fixed, nonzero filter component and, on the other hand, approximating the precompensated model response to a reference system response.

For design purposes, the precompensation filter is preferably regarded as being additively decomposed into a fixed, non-zero filter component and an adjustable compensator component. The fixed filter component is normally configured by the filter designer or set to a default configuration, whereas the adjustable compensator component is determined by optimizing a criterion function that includes the above weighting. As the fixed filter component, the weighting is normally configured by the filter designer or set to a default configuration. Once the fixed filter component is configured and the adjustable compensator component is determined, the filter parameters of the precompensation filter can be calculated and implemented. In many practical cases, it has turned out to be beneficial to include a by-pass component with at least one selectable delay element in the fixed filter component.

By making the weighting frequency-dependent and/or channel-dependent, a powerful design tool that provides full control over the degree and type of compensation performed in different frequency regions and/or in different subchannels is obtained. Preferably, the criterion function includes a frequency- and/or channel-weighted penalty term, which penalizes the compensating part of the precompensator. This kind of frequency-dependent and/or channel-dependent weighting makes it easy to avoid dangerous over-compensation, while attaining good compensation in frequency regions and channels where this can be attained safely.

The optimization of the weighted criterion function can be performed on-line, analogous to conventional on-line optimization, by using e.g. recursive optimization or adaptive filtering, or performed as a model-based off-line design.

In order to provide good compensation performance while using a limited number of filter parameters, an optimization-based methodology for adjusting realizable (stable and causal) Infinite Impulse Response (IIR) compensation filters is proposed. These digital filters can generate long impulse responses while containing a limited number of filter parameters. The so designed compensation filters may have several input- and output audio channels, and can be used for compensating single-channel as well as multi-channel audio equipment.

The proposed design principle and structure is particularly useful for linear dynamic design models and linear precompensation filters, but can also be generalized to the case of non-linear design models and non-linear precompensation filters.

The different aspects of the invention include a method, system and computer program for designing an audio precompensation filter, a so designed precompensation filter, an audio system incorporating such a precompensation filter as well as a digital audio signal generated by such a precompensation filter.

The present invention offers the following advantages:

- Strict control of the extent and amount of compensation to be performed by the precompensation filter, thus providing full control over the resulting acoustic response;
- Dangerous over-compensation can be avoided, while still attaining good compensation where this can be done safely;
- Good compensation performance, while using a limited number of filter parameters; and
- Optimally precompensated audio systems, resulting in superior sound quality and experience.

Other advantages and features offered by the present invention will be appreciated upon reading of the following description of the embodiments of the invention.

BRIEF DESCRIPTION OF THE DRAWINGS

The invention, together with further objects and advantages thereof, will be best understood by reference to the following description taken together with the accompanying drawings, in which.

DETAILED DESCRIPTION OF EMBODIMENTS OF THE INVENTION

Figure 1:
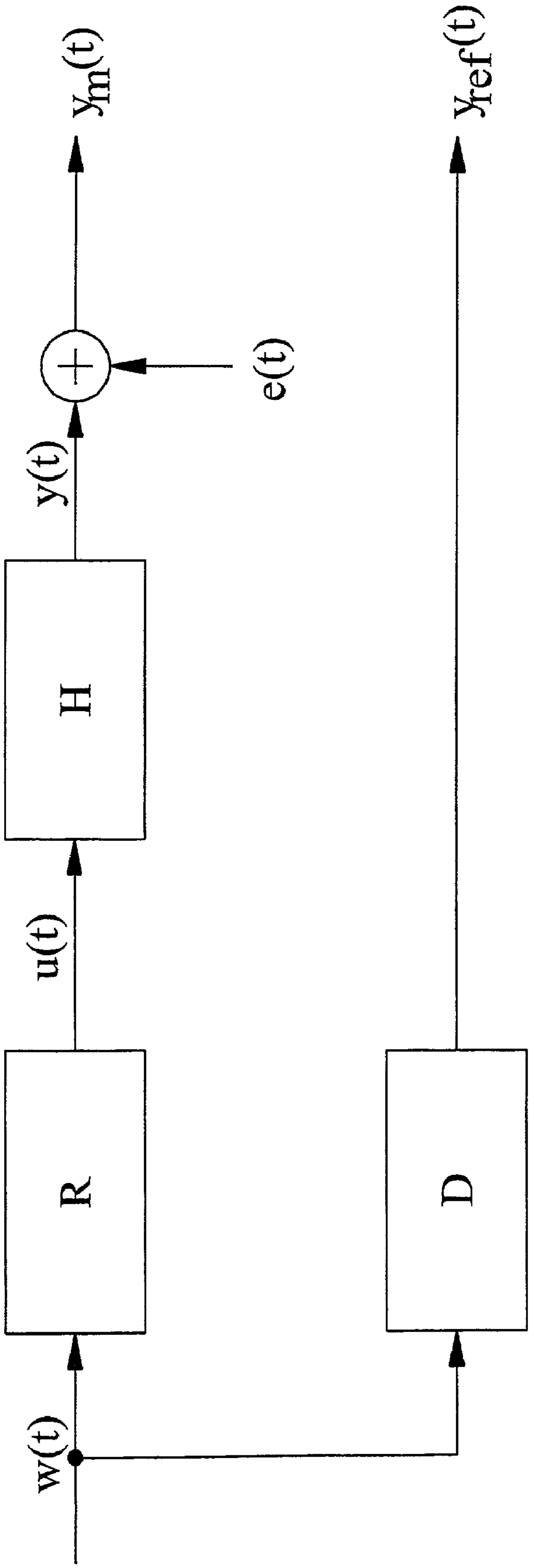
FIG. 1 is a general description of a compensated sound generating system.

Sections 1–3 describe linear cases, section 4 generalizes the structure and design principle to problems with nonlinear and possibly time-varying system models as well as non-linear and possibly time-varying compensators, and section 5 finally describes some implementational aspects.

1. Design for Linear Models and Filters

For a better understanding of the invention, it may be useful to begin by describing the general approach for designing audio precompensation filters.

The sound generation or reproducing system to be modified is normally represented by a linear time-invariant dynamic model H that describes the relation in discrete time between a set of p input signals u(t) to a set of m output signals y(t):

$$y(t)=Hu(t)\ y_m(t)=y(t)+e(t), \quad (1.1)$$

where t represents a discrete time index, $y_m(t)$ (with subscript m denoting "measurement") is an m-dimensional column vector representing the sound time-series at m different locations and e(t) is noise, unmodeled room reflexes, effects of an incorrect model structure, nonlinear distortion and other unmodeled contributions. The operator H is an m×p-matrix whose elements are stable linear dynamic operators or transforms, e.g. implemented as FIR filters or IIR filters. These filters will determine the response y(t) to a p-dimensional arbitrary input time series vector u(t). Linear filters or models will be represented by such matrices, which are called transfer function matrices, or dynamic matrices, in the following. The transfer function matrix H represents the effect of the whole or a part of the sound generating or sound reproducing system, including any pre-existing digital compensators, digital-to-analog converters, analog amplifiers, loudspeakers, cables and in some applications also the room acoustic response. In other words, the transfer function matrix H represents the dynamic response of relevant parts of a sound generating system. The input signal u(t) to this system, which is a p-dimensional column vector, may represent input signals to p individual amplifier-loudspeaker chains of the sound generating system.

The measured sound $y_m(t)$ is, by definition, regarded as a superposition of the term y(t)=Hu(t) that is to be modified and controlled, and the unmodeled contribution e(t). A prerequisite for a good result in practice is, of course, that the modeling and system design is such that the magnitude |e(t)| will not be large compared to the magnitude |y(t)|, in the frequency regions of interest.

A general objective is to modify the dynamics of the sound generating system represented by (1.1) in relation to some reference dynamics. For this purpose, a reference matrix D is introduced:

$$y_{ref}(t)=Dw(t), \quad (1.2)$$

where w(t) is an r-dimensional vector representing a set of live or recorded sound sources or even artificially generated digital audio signals, including test signals used for designing the filter. The elements of the vector w(t) may, for example, represent channels of digitally recorded sound, or analog sources that have been sampled and digitized. In (1.2), D is a transfer function matrix of dimension m×r that is assumed to be known. The linear system D is a design variable and generally represents the reference dynamics of the vector y(t) in (1.1).

An example of a conceivable design objective may be complete inversion of the dynamics and decoupling of the channels. In cases where r=m, the matrix D is then set equal to a square diagonal matrix with d-step delay operators as diagonal elements, so that:

$$y_{ref}(t)=w(t-d)$$

The reference response of y(t) is then defined as being just a delayed version of the original sound vector w(t), with equal delays of d sampling periods for all elements of w(t).

More complicated designs may add reference dynamics to the sound generating system in the form of stable filters, in addition to introducing a delay. With such a design of D, it may be possible to add a new sound characteristic to the system, e.g. obtaining superior sound quality with low quality audio equipment. A more complicated design may be of interest, e.g. when emulating a specific type of sound generating system. The desired bulk delay, d, introduced through the design matrix D is an important parameter that influences the attainable performance. Causal compensation filters will attain better compensation the higher this delay is allowed to be.

The precompensation is generally obtained by a precompensation filter, generally denoted by R, which generates an input signal vector u(t) to the audio reproduction system (1.1) based on the signal w(t):

$$u(t)=Rw(t). \quad (1.3)$$

In the prior art, the predominating trend of digital audio precompensation is to generate the input signal vector u(t) to the audio reproduction system (1.1) so that its compensated output y(t) approximates the reference vector $y_{ref}(t)$ well, in some specified sense. This objective can be attained if the signal u(t) in (1.1) is generated by a linear precompensation filter R, which consists of a p×r-matrix whose elements are stable and causal linear dynamic filters that operate on the signal w(t) such that y(t) will approximate $y_{ref}(t)$:

$$y(t)=Hu(t)=HRw(t)\cong y_{ref}(t)=Dw(t).$$

Within general systems theory, the condition for exact compensation is that R equals a causal and stable right inverse of the dynamic model H, multiplied from the right by D, $$R=H^{-R}D.$$

Here, $H^{-R}$ denotes the right inverse of the transfer function matrix of the model. Such a right inverse will by definition have the property $HH^{-R}=I_m$ (the identity matrix of size m×m). Therefore, $HR=HH^{-R}D=D$.

Unfortunately, the model of an audio system will often not have an exact stable and causal right inverse. However, assume that the bulk delay d within D (the smallest delay caused by any element of D) is allowed to increase. Then, the least squares approximation error $|y(t)-y_{ref}(t)|^2$ attained by stable and causal compensation filters can be shown to vanish as the delay d→∞, if the normal rank of H (the rank of the transfer function matrix except at system zeros) is equal to m (the number of elements in y(t)). In our context, the delay d is determined by the designer, who can thereby control the degree of approximation.

For a good pre-compensation to be feasible, the system described by H will need to have at least as many separate inputs as outputs, i.e. p≧m. Otherwise, the rank of H could never be as large as m. In the simplest case, we have a scalar model and scalar reference dynamics where m=p=r=1, so y(t), u(t) and w(t) are all scalar time-series. The model H may then represent a single amplifier-loudspeaker chain to be compensated.

In the prior art and literature, the most promising methods for solving this type of approximation problem have focused on representing H and R by FIR filters and then using least squares techniques to minimize a scalar criterion that penalizes the average sum of squared differences between the elements of y(t) and $y_{ref}(t)$:

$$E((y(t)-y_{ref}(t))^T(y(t)-y_{ref}(t)))=E(|y(t)-y_{ref}(t)|^2). \quad (1.4)$$

Here and in the following, $(\ )^T$ denotes the transpose of a vector and E( ) represents an average over the relevant statistical properties of the involved signals. Such a least squares design can be accomplished by on-line recursive minimization of (1.4), by applying, for example, the LMS algorithm or the filtered-x LMS algorithm [12, 13] to the measured signals $y_m(t)$ and to w(t), see the references cited in the background section. The design can also be performed off-line, by solving a Wiener optimization problem for FIR filters of fixed degrees. This is equivalent to solving a set of linear simultaneous equations, the Wiener-Hopf equations, which involve correlation estimates. The minimization of (1.4) takes not only the amplitude response but also the phase response of the system into account. This approach is better than methods that only take the amplitude response into account, e.g. as described in [14]. A drawback with the use of FIR filters is that filters with a very large number of coefficients may have to be used. For this reason, the present invention focuses on the adjustment of IIR filters, which in general require fewer coefficients. Regardless of the use of FIR or IIR filters, a careful analysis made by the inventors reveals that all prior art designs based on the minimization of the least squares criterion (1.4) suffer from further significant drawbacks:

- Compensation filters based on the minimization of (1.4) will obtain extreme properties at the highest and the lowest frequencies. In the scalar case, this is due to the transfer function H often having low gain at the highest and lowest frequencies within the audio range, which results in a compensator R having high gain at these frequencies. Such compensators have long and oscillative impulse responses, see FIG. 4, that are computationally demanding to adjust and to implement. This is a potential problem not only at very high and low frequencies but also for all frequencies where an excessive amount of compensation is demanded if the criterion (1.4) is to be minimized.
- Compensation filters R with too high gains at some frequencies may furthermore generate nonlinear distortion, which will have a detrimental effect on the performance. In the worst case, high-gain inputs may damage the audio equipment.

It has thus been recognized that there is a need to attain better control, than that provided by (1.4), over the extent and amount of compensation performed at different frequencies and in different subchannels.

In the design of a precompensation filter for audio equipment according to the invention, it has turned out to be useful to regard the filter as being additively decomposed into two components, a fixed, non-zero filter component and an adjustable compensator component to be determined by optimization. The fixed filter component is normally configured by the filter designer or set to a default configuration. The adjustable compensator component on the other hand is determined by optimizing a criterion function based on a given weighting between, on one hand, approximating the precompensation filter to the fixed, non-zero filter component and, on the other hand, approximating the precompensated model response to the reference system response. Although not required, this weighting is preferably made frequency- and/or channel-dependent, as will be exemplified below.

In order to more clearly understand the basic concepts of the invention, the design of a precompensation filter based on such a weighting will now be described by way of examples.

For example, the compensation may be realized as an additive modification m(t)=Cw(t) of a signal path which is normally just a direct feed-through and delay of the signal w(t):

$$u(t)=w(t-g)+m(t)=w(t-g)+Cw(t), \quad (1.5)$$

where g is an appropriate delay and C typically is a matrix of FIR or IIR filters. In (1.5), u(t) and w(t) are assumed to have equal dimension, m=r. Using the standard backward shift operator notation:

$$w(t-1)=q^{-1}w(t),$$

the compensator matrix in (1.3) is thus for design purposes regarded as having the form:

$$R(q^{-1})=(q^{-g}+C(q^{-1})).$$

The design of the compensator component C is preferably based on the minimization of a criterion function which includes a frequency-weighted term that penalizes the magnitude of the additive modification signal m(t)=C w(t). Such a penalty term can be included in any type of criterion used for the filter optimization. In particular, the quadratic criterion function (1.4) may be replaced by:

$$J=E(|V(y(t)-y_{ref}(t))|^2)+E(|Wm(t)|^2)==E(|V(HR-D)w(t)|^2)+E(|WCw(t)|^2), \quad (1.6),$$

where W is a first weighting function and V is an additional optional weighting function. The matrix W is preferably a square (m×m) matrix, containing stable linear IIR filters that represent a set of design variables. Furthermore, the additional weighting function V is preferably a square (p×p) matrix containing stable linear IIR filters that may be used as another set of design variables.

In a particular embodiment of the invention, the weighting represented by the transfer function matrix W acts as a frequency-dependent penalty on the compensation signal m(t)=Cw(t). The effect of the weighting by W is best understood in the frequency domain, using a Z-transform representation of signals and systems. The minimization of (1.6) will result in the compensator term C(z) having small gains at frequencies z where the norm of W(z) is relatively large. This is because the last term of (1.6) would otherwise dominate J. In such frequency regions, C(z)w(z) will be small in (1.5), so the properties of the uncompensated system will remain unaltered, except for a delay of g samples. On the other hand, at frequencies z where the norm of W(z) is vanishingly small, the first term of the criterion (1.6) is the most important. If V=I, then $y(z)\approx y_{ref}(z)=D(z)\,w(z)$ within these frequency regions, since this adjustment minimizes the contribution of the first term of (1.6) to the total criterion value.

For example, the weighting function represented by W may be realized as a low-pass filter with a given cutoff frequency, in parallel with a high-pass filter with a given limit frequency. By properly selecting the cutoff frequency and limit frequency, the compensation performed by the precompensation filter may be customized according to the particular application. Of course, the weighting W may be realized in any suitable form.

The frequency-selective weighting by the matrix V may be used for various purposes.

- It may be used for perceptual weighting, using the known characteristic of the human ear. The elimination of compensation errors in frequency regions to which we are more sensitive is then emphasized.
- It may also be used for placing a low weight at performance deviations in frequency regions where the modeling error in H is large, so that the optimization does not focus on frequency regions where the result would be unreliable anyway.
- It may furthermore be used to weight the errors attained at different locations in space, i.e. in different components of the vector y(t). This can be attained by setting V equal to a diagonal transfer function matrix and by using different filters as diagonal elements of V.

The use of frequency-dependent weighting enables different types of adjustments in different frequency regions, although the design model H describes the whole relevant frequency range. Solutions that decompose the total frequency region into sub-bands and separately compensate each band can thus be avoided. Besides being more complicated, sub-band solutions, which are used in e.g. graphic equalizers, are known to create problems with distortions of the phase response.

Note also that W may be a matrix of weighting filters in the multi-channel case. It is possible to use a diagonal matrix, with each diagonal element being different, to separately tune the compensation performed on each input channel to the properties of that particular loudspeaker. This kind of channel-dependent weighting may be performed independently to enable different types of compensation in different channels of said multi-channel system, using frequency-independent weighting or frequency-dependent weighting for the individual channels.

The delay g of the direct feed-through (or bypass) in (1.5) is yet another design variable. An appropriate choice in the scalar case (m=p=r=1) if $d \geqq k$ is to set g=d−k, where d is the bulk delay of D while k is the bulk delay of H. In this way, the total net delay through the compensated system will approximately be g+k=d in all frequency regions: In the regions that are penalized significantly by W, we have $u(t) \approx w(t-g)$, so the total delay of the compensated model HR will be g+k. In regions where W is insignificant, $HR \approx D$, which has been pre-assigned the delay d.

For multi-channel compensators, different feed-through delays as well as different bulk delays in D may be required in different channels. Such channel-dependent delays are useful for generating virtual sound sources i.e. sound appearing to emanate from directions other than from the loudspeakers. To include such and other variants of the compensation problem and also handle cases where the number of signals in w(t) differs from the number of signals in y(t), $r \neq m$, (1.5) is generalized to $$u(t)=Fw(t)+Cw(t),$$

where F is an arbitrary m×r matrix of stable linear dynamic systems. This matrix is assumed known, and is not to be modified by the optimization. The special case where F is identical to zero corresponds to using a penalty on the compensator output u(t), which would then be identical to m(t). This special case has been discussed in the prior art, in the special case of scalar systems, with a quadratic criterion with the special weight selections V=1 and W equal to a frequency-independent weight, see [17]. Such optimized feed-forward regulators have also been designed for process control purposes, see [18, 19]. This type of design has turned out to be inappropriate for audio precompensation and is therefore excluded from the proposed solution. A large penalty W would for F=0 quench the magnitude of the whole signal vector u(t), which is in itself a major distortion of the pre-existing system properties. A main purpose of the proposed compensator design is instead to introduce a penalty that may leave the natural response of the system unchanged, which is here obtained for large W and $F=q^{-g}I$.

A key element in the proposed design is that the compensator (1.3) is, for design purposes, assumed to be decomposed additively into two parts:

$$R=F+C, \tag{1.7}$$

where F is fixed and nonzero while C is the subject of optimization. Note that the special case (1.5) of (1.7) corresponds to $F=q^{-g}I$, for r=m. The fixed, non-zero filter component F may thus be a simple by-pass component with a selectable delay. However, nothing prevents F from being configured with one or more additional fixed filtering components.

In general terms, the proposed design principle for obtaining C in the compensator (1.7) is to optimize a criterion involving a weighting of two objectives: i) as small deviation between the total precompensator filter R and a predetermined dynamic non-zero filter component F as possible, and ii) as small deviation between the compensated design model HR and a predetermined dynamic reference system D as possible. In particular, when this weighting is made frequency-dependent and/or input channel dependent, an efficient tool for automated/computer-supported filter design is obtained that provides control over the amount of compensation performed in different frequency regions and/or in different subchannels of a multichannel design.

The pre-compensation filter of the present invention is generally implemented as a digital filter, or a set of digital filters in multi-channel systems.

The filters and models may be represented by any operator or transform representation appropriate for linear systems, such as the delay operator form, the Z transform representation, delta operator representations, functional series representations or the frequency warped representations introduced in [20]. The degree of approximation (closeness) could here be measured by any norm for matrices of linear time-invariant dynamic systems, such as the quadratic norm (1.6), frequency weighted $H_\infty$-norms or weighted $L_1$-norms cf.[21,22].

For a better understanding of the advantages offered by the present invention, a comparison between the performance of a precompensation filter designed according to the present invention and a precompensation filter designed based on prior art techniques will now be made. In this example, the precompensation filters are applied to a single loudspeaker and amplifier chain.

Figure 2A:
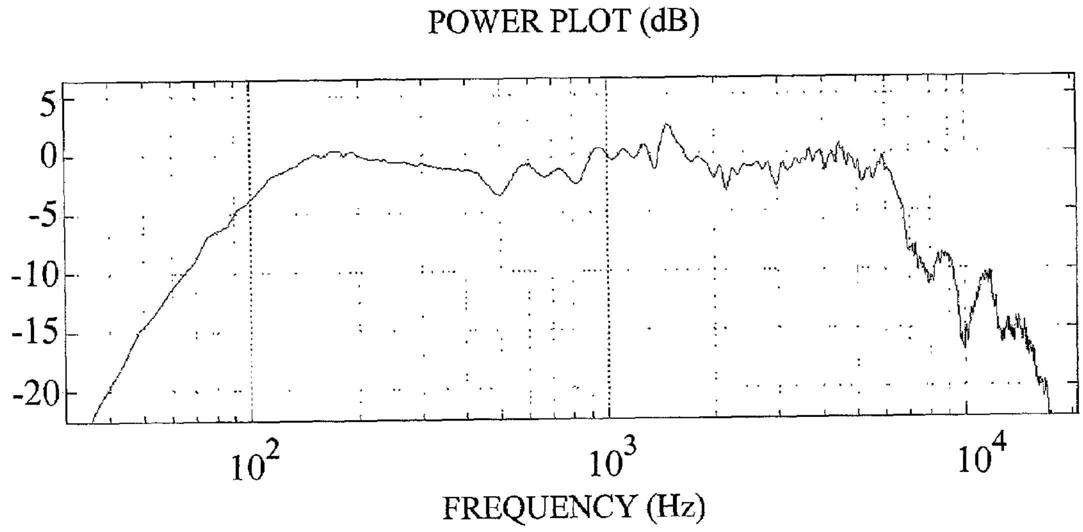
FIG. 2A is a graph illustrating the amplitude response of an uncompensated loudspeaker model.
Figure 2B:
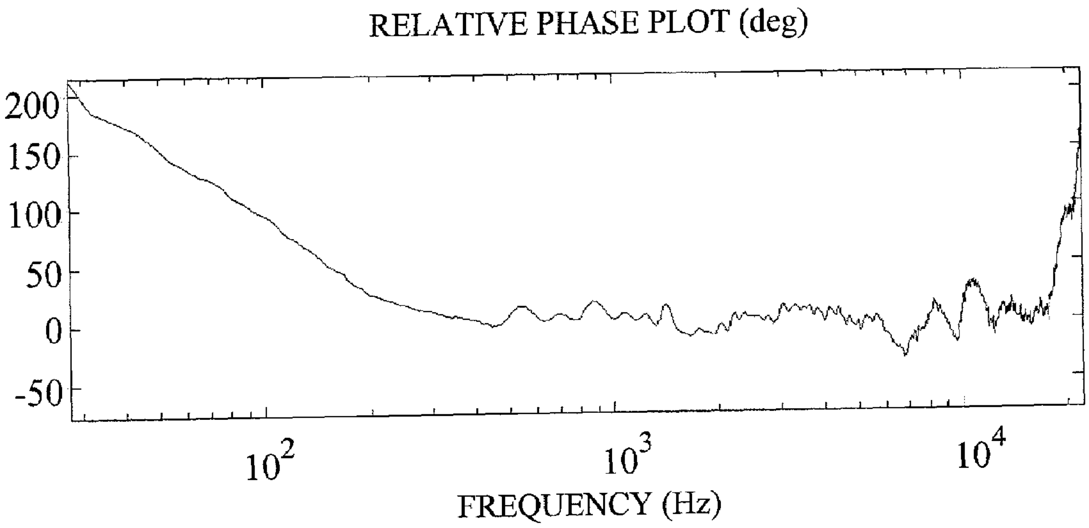
FIG. 2B is a graph illustrating the deviation of the phase response of an uncompensated loudspeaker model relative to the phase shift of a pure delay.
Figure 3:
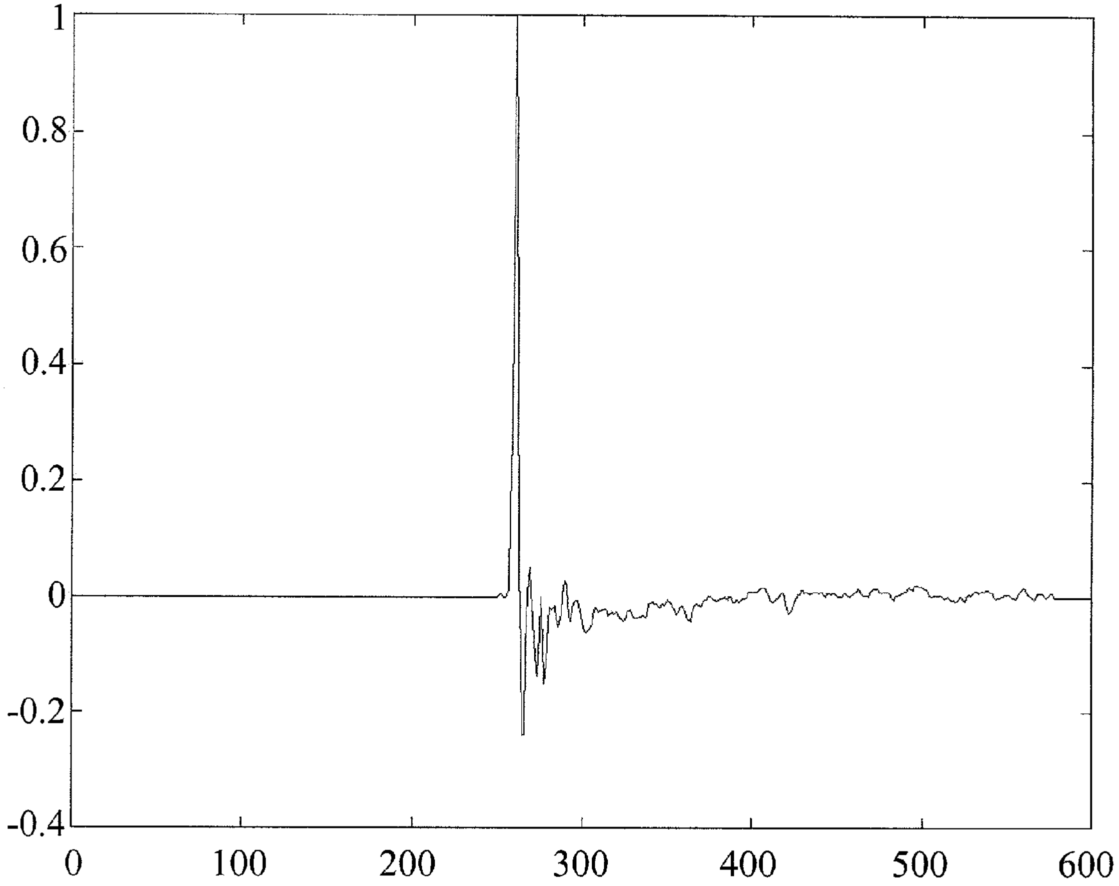
FIG. 3 illustrates the discrete-time impulse response of the loudspeaker model of FIGS. 2A and 2B, sampled at 44.1 kHz and for illustration delayed by 250 samples.

The amplitude response and the deviation of the phase response of the modeled audio chain are illustrated in FIG. 2A and FIG. 2B, respectively, and the model impulse response is shown in FIG. 3. The sampling frequency is 44.1 kHz. The design model has zero bulk delay k, although its impulse response has in FIG. 3 been shifted to the right for easier comparison with the compensated response. We use $y_{ref}(t)=w(t-d)$, with d=300 samples, as desired reference in (1.2). As can be seen in FIG. 2A, the amplitude response of the uncompensated experimental loudspeaker and amplifier model is far from ideal, with ripples in the mid-frequency area and low power at low and high frequencies.

Figure 5:
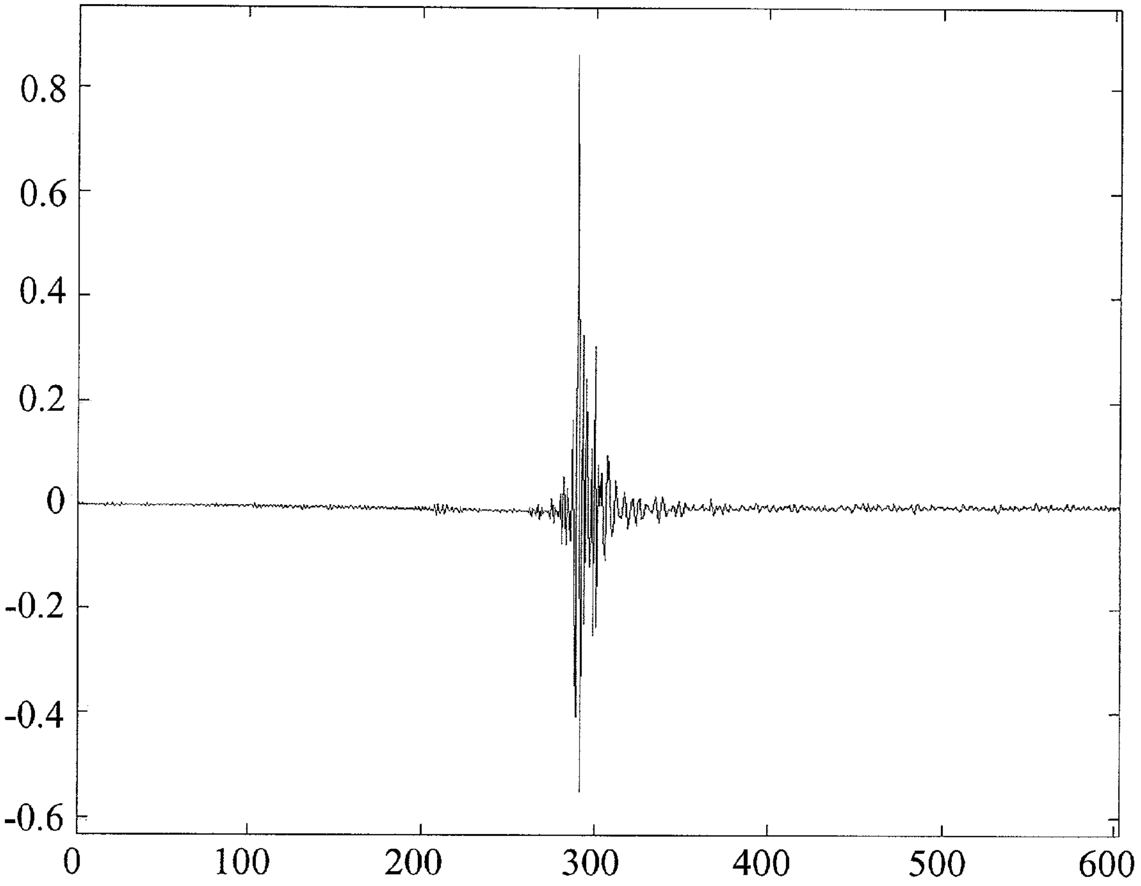
FIG. 5 displays the impulse response of a scalar IIR compensation filter designed based on the loudspeaker model of FIGS. 2A, 2B and 3 according to the present invention.
Figure 6A:
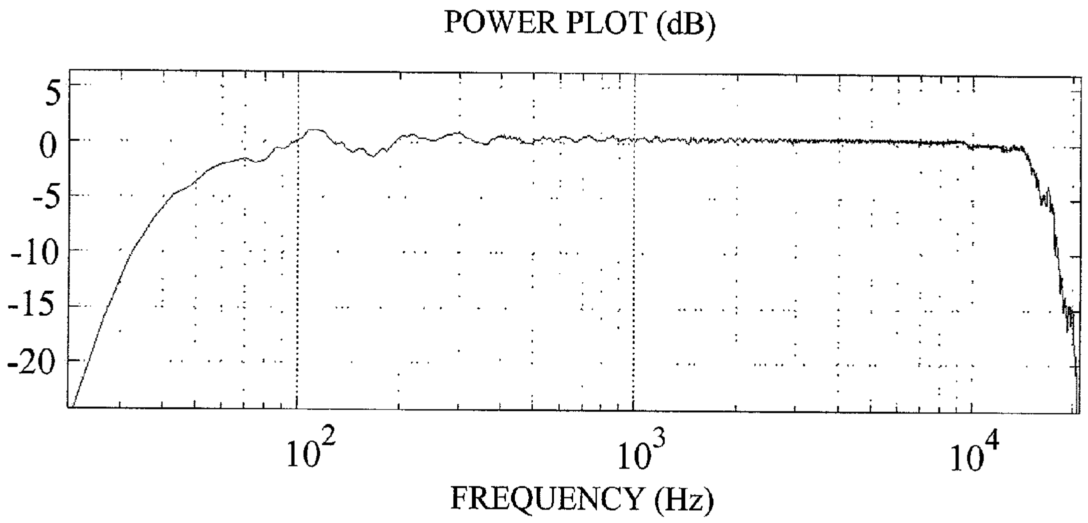
FIG. 6A is a graph illustrating the amplitude response of the loudspeaker model of FIG. 2A, compensated by the IIR filter of FIG. 5.
Figure 6B:
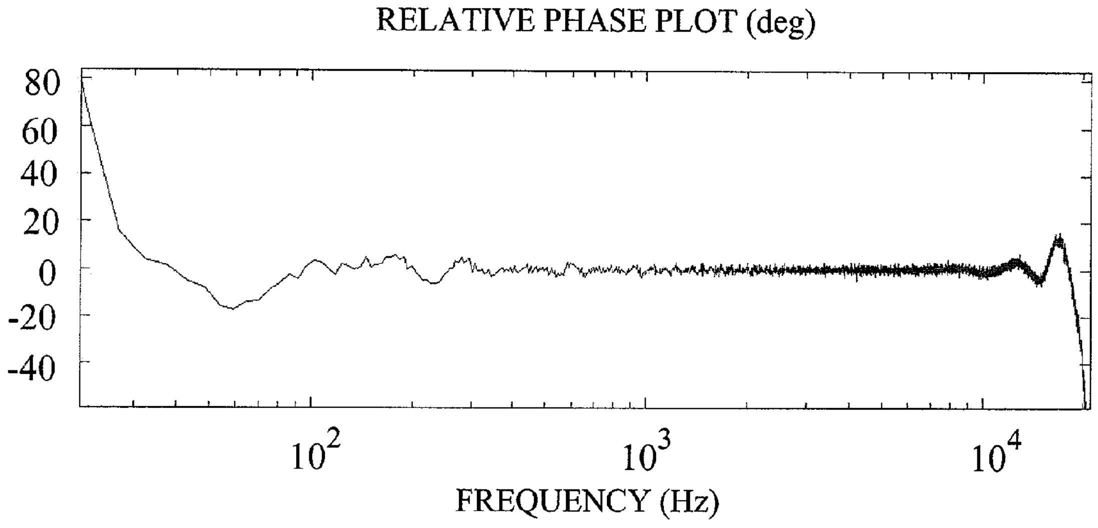
FIG. 6B is a graph illustrating the deviation of the phase response of the loudspeaker model of FIG. 2B, compensated by the IIR filter of FIG. 5, relative to the phase shift of a pure delay.
Figure 7:
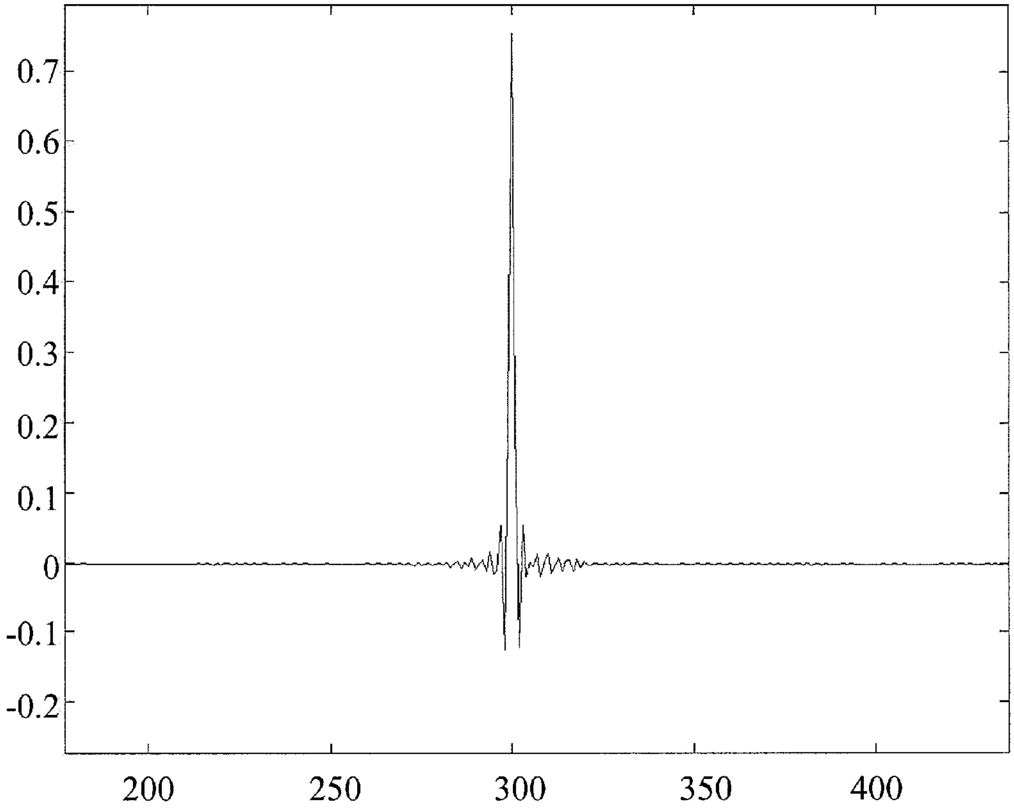
FIG. 7 is the compensated impulse response of the loudspeaker model of FIG. 3, compensated with the IIR filter of FIG. 5.
Figure 8:
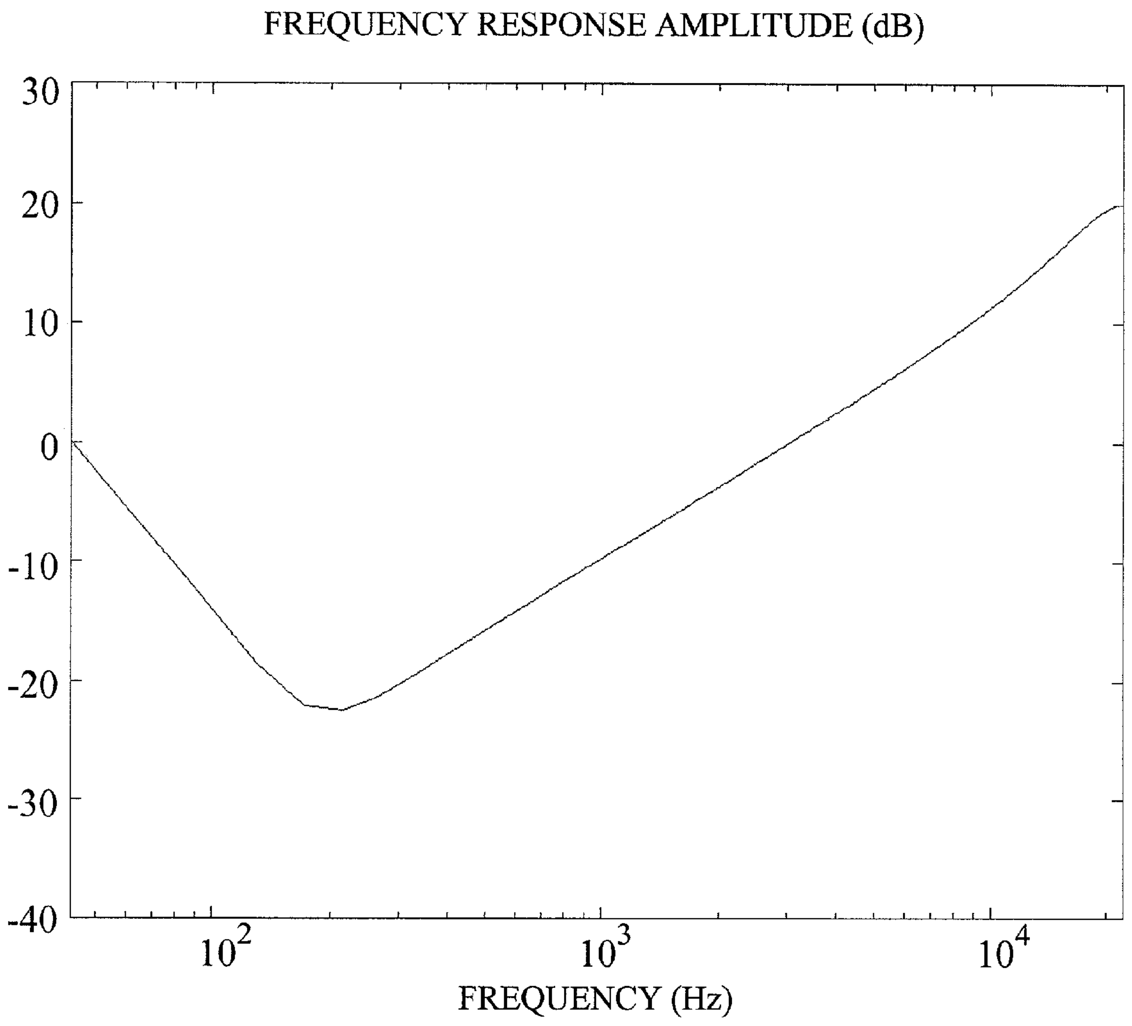
FIG. 8 shows the frequency response amplitude of a weighting function used in the design of the IIR filter of FIG. 5.
Figure 9:
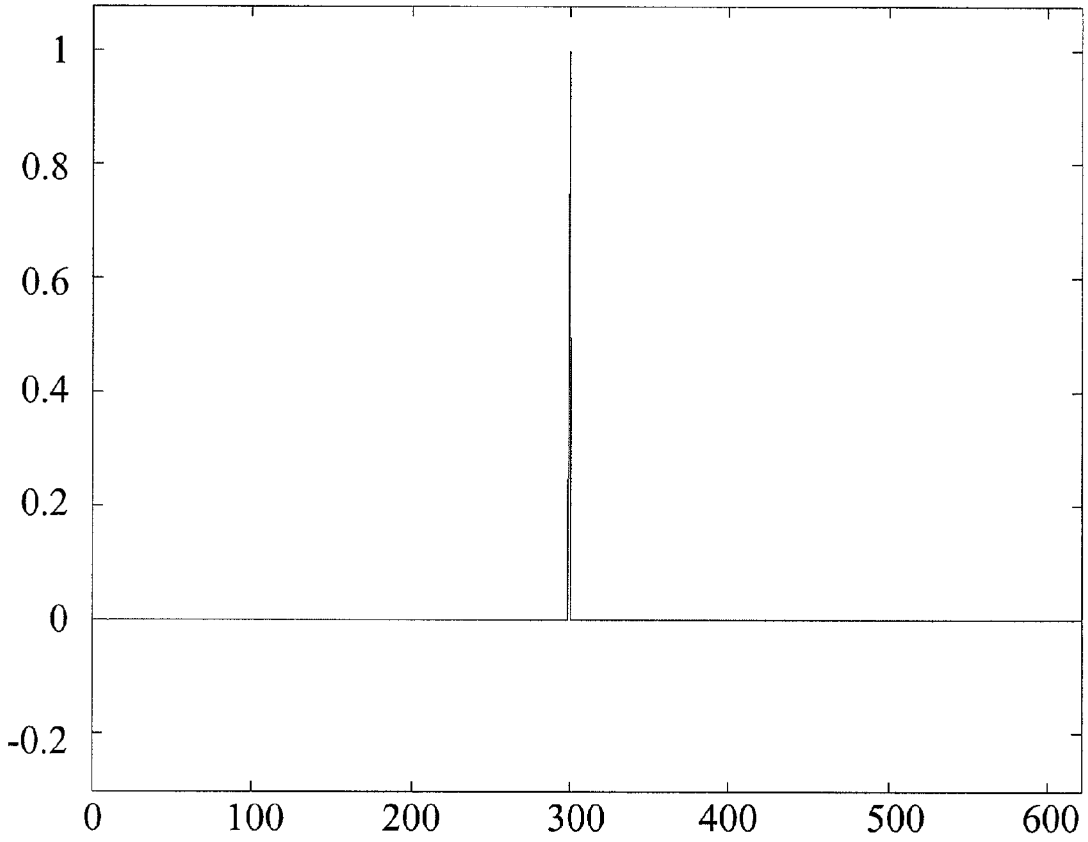
FIG. 9 illustrates the compensated impulse response of FIG. 8 when using compensation with no control penalty.

First of all, this experimental model is compensated by minimizing (1.6) with a realizable (stable and causal) IIR compensator (1.5) according to the teachings of the present invention. The polynomial Wiener design specified in more detail in Section 2 below is used. Complete inversion of the whole audio range from 20 Hz to 20000 Hz would require extreme amplification at the lowest and highest frequencies in FIG. 2A. If the whole audio range is to be inverted, compensation signals with too high power may be generated, especially for the highest and lowest frequencies. Such a high power signal may damage the audio equipment and therefore the aim will instead be to invert the loudspeaker dynamics perfectly (up to a delay of d=g=300) within the frequency range of 80 Hz to 15 kHz. The amplification should also be less than 20 dB outside of this range. The weighting W in (1.6) that is used in this particular design consists of a low-pass filter with a cutoff frequency of 30 Hz, in parallel with a high-pass filter with a limit frequency of 17 kHz, see FIG. 8. The impulse response of the designed IIR precompensation filter is illustrated in FIG. 5. The compensated amplitude response and the deviation of the phase response are shown in FIGS. 6A and 6B, respectively. As can be seen in FIG. 6A, the mid-frequency ripple in FIG. 2A has been eliminated and the amplitude response within the compensated frequency range (80 Hz to 15 kHz) closely follows the desired flat response (amplitude response=0 dB). Also the deviation of the phase response of the compensated model system, FIG. 6B, has been markedly improved compared to the uncompensated deviation of the phase response in FIG. 2B. The compensated impulse response, displayed by FIG. 7, is close to the ideal Dirac pulse response $y_{ref}(t)=w(t-300)$. The remaining small ripple close to the main peak is due to the fact that we have limited the amount of compensation at the lowest and the highest frequencies. This ripple can be removed by using W=0 in the design, see FIG. 9, at the price of designing a precompensation filter with very high gain at the lowest and highest frequencies.

Figure 4:
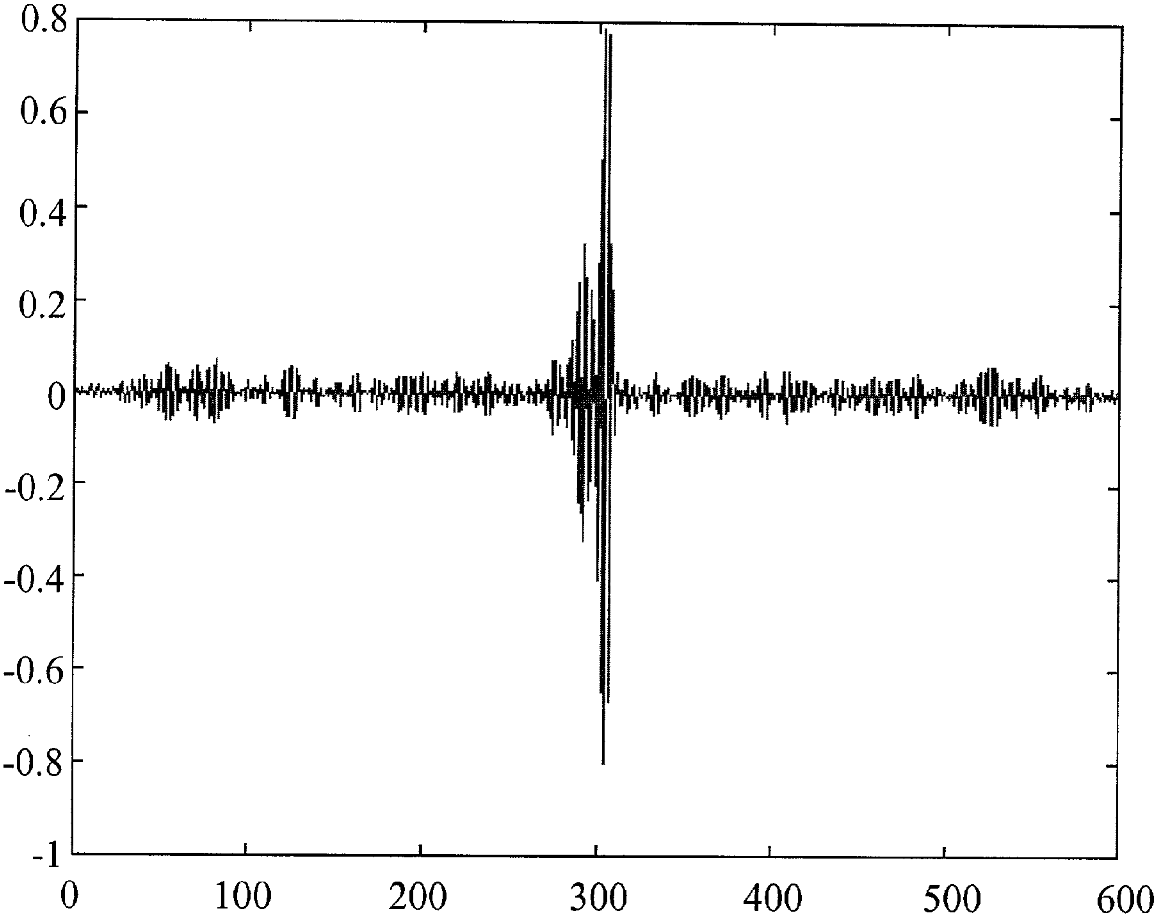
FIG. 4 is an illustration of the impulse response of a scalar FIR compensation filter designed according to prior art techniques to invert the loudspeaker dynamics of FIGS. 2A, 2B and 3.
Figure 10A:
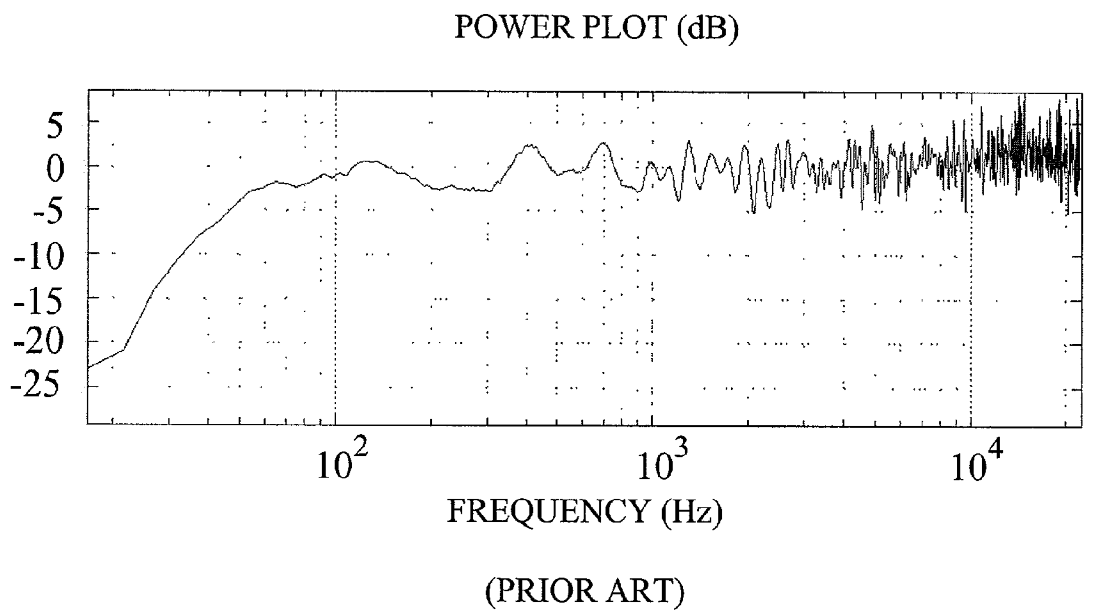
(PRIOR ART) Fig. 10A
FIG. 10A is a graph illustrating the amplitude response of the loudspeaker model of FIG. 2A, compensated by the prior art FIR filter of FIG. 4.
Figure 10B:
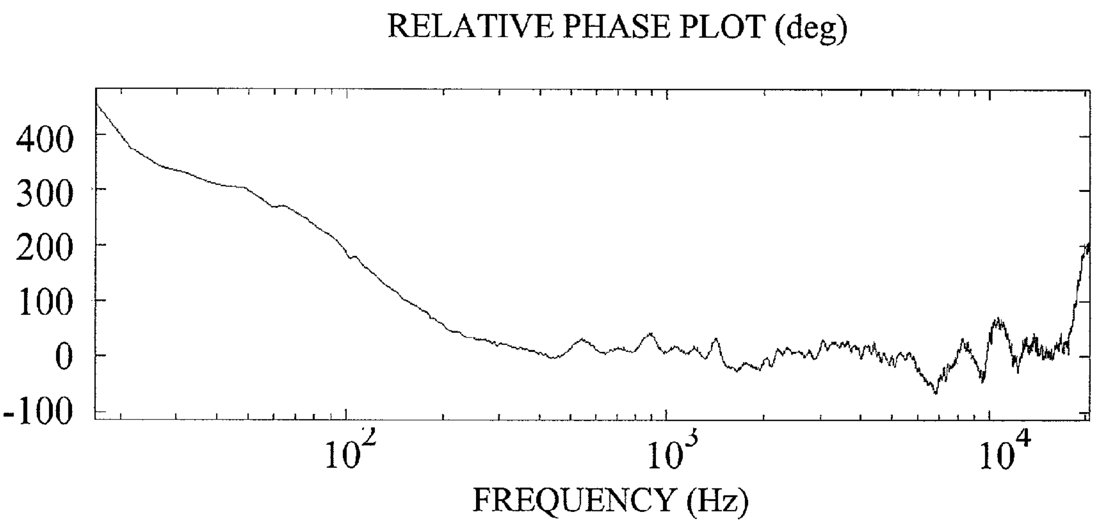
(PRIOR ART) Fig. 10B
FIG. 10B is a graph illustrating the deviation of the phase response of the loudspeaker model of FIG. 2B, compensated by the prior art FIR filter of FIG. 4, relative to the phase shift of a pure delay.

These results are then compared to an FIR filter precompensator that has been designed by minimization of the least squares criterion (1.4), using the idealized LMS algorithm with an appropriately tuned step length. The impulse response of this prior art compensator is shown in FIG. 4. Such compensators have long and oscillative impulse responses that are computationally demanding to adjust and implement. This is a potential problem not only at very high and low frequencies but also for all frequencies where an excessive amount of compensation is demanded if the criterion (1.4) is to be minimized. The amplitude response and relative phase response of the prior art compensated system are illustrated in FIGS. 10A and 10B, respectively. The amplitude response of this compensated system shows much more oscillation for mid-frequencies and especially for the highest frequencies, compared to a system compensated with a filter according to the present invention. Thus, the inventive design results in a much shorter and better behaved compensation filter and also provides a more exact inversion within the frequency range where compensation is desired.

2. Scalar Compensators Designed as Casual Wiener Filters

In the following, a precompensation filter design method, where scalar filters are designed as causal Wiener filters is described with reference to FIG. 11. As an example of an embodiment of the invention, consider the problem of pre-compensating a single audio chain (amplifier, cables, loudspeaker and possibly room acoustics). The scalar model H may represent the average over the dynamics measured at a number of points relative to the loudspeaker, so that the spatial volume where good compensation is attained is enlarged. The room acoustic response is in some types of problems neglected, so that only the loudspeaker chain is compensated. The linear systems and models are, in this case, all assumed to be time-invariant. They are represented using the discrete-time backward shift operator, here denoted by $q^{-1}$. A signal s(t) is shifted backward by one sample by this operator: $q^{-1}s(t)=s(t-1)$. Likewise, the forward shift operator is denoted q, so that qs(t)=s(t+1), see e.g.[23]. A scalar design model (1.1) is then represented by a linear time-invariant difference equation with fixed coefficients:

$$y(t)=-a_1y(t-1)-a_2y(t-2)- \ldots -a_ny(t-n)+b_0u(t-k)+b_1u(t-k-1)+ \ldots +b_hu(t-k-h). \tag{2.1}$$

Assuming $b_0\neq0$, there will be a delay of k samples before the input u(t) influences the output y(t). This delay, k, may for example represent an acoustic transport delay and it is here called the bulk delay of the model. The coefficients $a_j$ and $b_j$ determine the dynamic response described by the model. The maximal delays n and h may be many hundreds or even thousands of samples in some models of audio systems.

Move all terms related to y to the left-hand side. With the shift operator representation, the model (2.1) is then equivalent to the expression:

$$(1+a_1q^{-1}+a_2q^{-2}+ \ldots +a_nq^{-n})y(t)=(b_0+b_1q^{-1}+ \ldots +b_hq^{-h})u(t-k).$$

By introducing the polynomials $A(q^{-1})=(1+a_1q^{-1}+a_2q^{-2}+ \ldots +a_nq^{-n})$ and $B(q^{-1})=(b_0+b_1q^{-1}+ \ldots +b_hq^{-h})$, the discrete-time dynamic model (2.1) may be represented by the more compact expression:

$$A(q^{-1})y(t)=B(q^{-1})u(t-k). \tag{2.2}$$

The polynomial $A(q^{-1})$ is said to be monic since its leading coefficient is 1. In the special case of FIR models, $A(q^{-1})=1$. In general, the recursion in old outputs y(t-j) represented by the filter $A(q^{-1})$ gives the model an infinite impulse response. IIR filters represented in the form (2.2) are also denoted rational filters, since their transfer operator may be represented by a ratio of polynomials in $q^{-1}$:

$$y(t)=\frac{B(q^{-1})}{A(q^{-1})}u(t-k).$$

All involved IIR systems, models and filter are in the following assumed to be stable. The stable criterion means that, when a complex variable z is substituted for the operator q, this is equivalent to the equation $A(z^{-1})=0$ having solutions with magnitude |z|<1 only. In other words, the complex function $A(z^{-1})$ must have all zeros within the unit circle in the complex plane.

The assumed second order statistics (spectral properties) of the signal w(t) to be compensated may be represented by a stable and stably invertible autoregressive moving average (ARMA) model:

$$H(q^{-1})w(t)=G(q^{-1})v(t),$$

where v(t) is white noise and the polynomials $H(z^{-1})$ and $G(z^{-1})$ are both monic and have all their zeros in |z|<1, i.e. are stable.

The design model (1.2), representing the desired response for y(t), is represented by the stable difference equation:

$$N(q^{-1})y_{ref}(t)=D(q^{-1})w(t-d), \tag{2.3}$$

where the polynomial $N(q^{-1})$ is monic and the leading polynomial coefficient in $D(q^{-1})$ is assumed to be nonzero, so d represents the desired bulk delay.

The compensator structure used is (1.7), in which the fixed filter F is set to an FIR filter polynomial) $F(q^{-1})$ and the bypass delay g is set equal to d−k assuming d≧k. This choice of g has been briefly motivated in the above section. Thus, $$u(t)=R(q^{-1})w(t)=F(q^{-1})w(t-d+k)+m(t)\ m(t)=C(q^{-1})w(t). \tag{2.4}$$

The stable discrete-time scalar rational filter $C(q^{-1})$ is now to be optimized, by minimizing the quadratic criterion (1.6). Here, it is assumed that V=1 for simplicity, while Wm(t) is a scalar and stable dynamic system with output f(t), represented by the difference equation:

$$V(q^{-1})f(t)=W(q^{-1})m(t). \tag{2.5}$$

Both of the polynomials $V(z^{-1})$ and $W(z^{-1})$ are design variables. They are restricted to have all their zeros in $|z|<1$. Thus, the criterion (1.6) can be expressed by:

$$J=E(|(y(t)-y_{ref}(t))|^2)+E(|f(t)|^2). \tag{2.6}$$

The optimizing solution is specified below.

Figure 11:
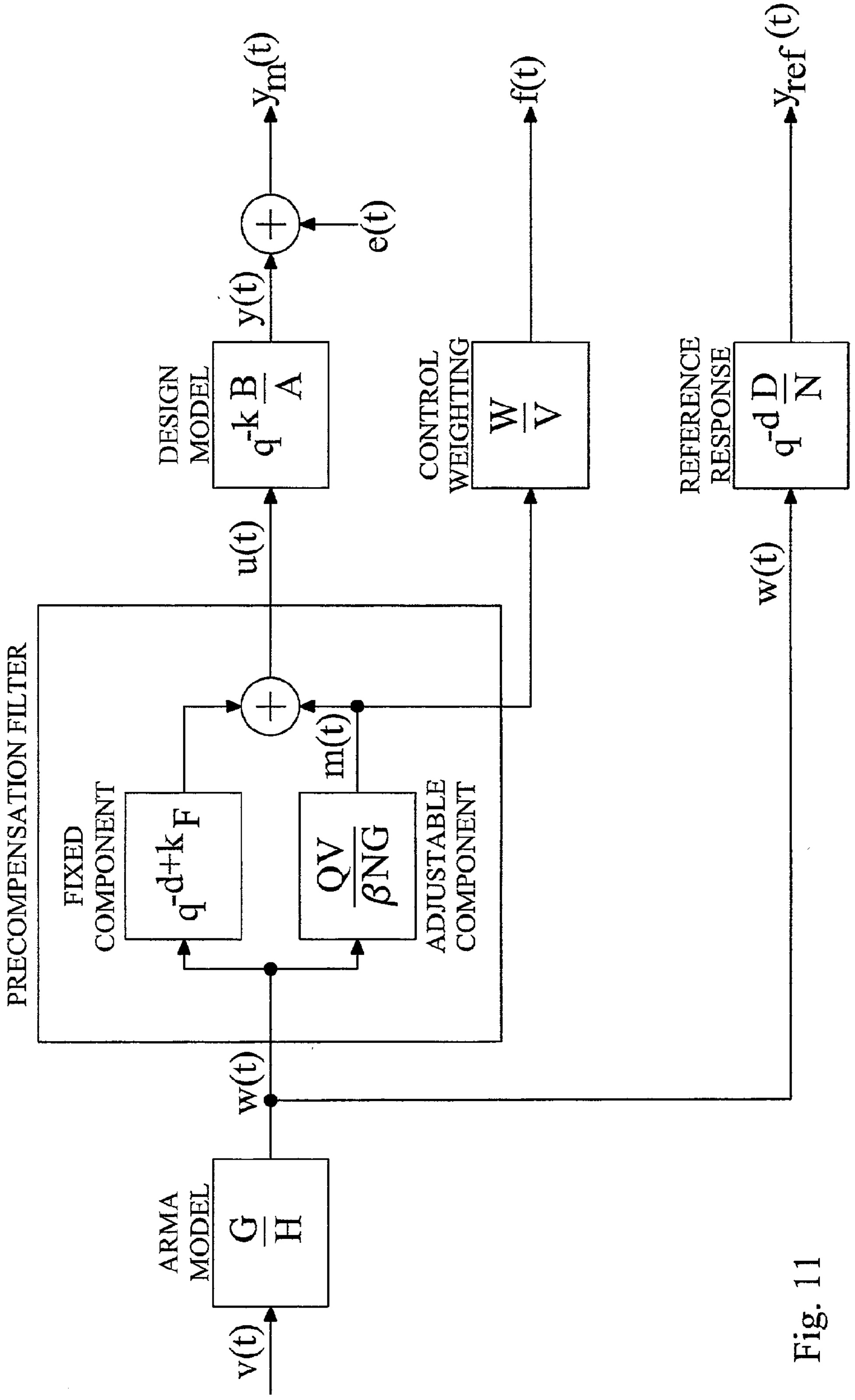
FIG. 11 is a schematic diagram illustrating a particular embodiment of a filter design structure according to the present invention.

Assume that the model and filter polynomials V, W, G, H, D, N, B, A and the delays k and d, which were introduced above and that are illustrated in FIG. 11, are specified numerically. The stable and causal IIR filter $C(q^{-1})$ in (2.4) that minimizes the criterion (2.6) is then specified by the difference equation:

$$\beta(q^{-1})N(q^{-1})G(q^{-1})m(t)=Q(q^{-1})V(q^{-1})w(t), \tag{2.7}$$

where the monic polynomial $\beta(q^{-1})$ has all its zeros in $|z|<1$. It is, together with a scalar r, given as the unique stable and monic solution to the polynomial spectral factorization equation:

$$r\beta(q^{-1})\beta^*(q)=V(q^{-1})V^*(q)B(q^{-1})B^*(q)+W(q^{-1})W^*(q)A(q^{-1})A^*(q), \tag{2.8}$$

while the polynomial $Q(q^{-1})$ in (2.7) is, together with an anti-causal FIR filter L*(q), given by the unique solution to the linear scalar Diophantine polynomial equation:

$$z^{-d+k}[D(q^{-1})A(q^{-1})-F(q^{-1})B(q^{-1})N(q^{-1})]G(q^{-1})V^*(q)B^*(q)=Q(q^{-1})r\beta^*(q)-A(q^{-1})N(q^{-1})H(q^{-1})qL.(q). \tag{2.9}$$

Above, polynomials in the forward shift operators represent anti-causal operators that would shift signals forward in time. They are indicated by stars as subscripts. For a polynomial $P(q^{-1})=(p_0+p_1q^{-1}+p2q^{-2}+ \ldots +p_{np}q^{-np})$ with real-valued coefficients, the conjugated polynomial is defined by $P^*(q)=(p_0+p_1q+p_2q^2+ \ldots +p_{np}q^{np})$.

Since $\beta(q^{-1})$ will have zeros only in $|z|<1$, while $N(q^{-1})$ and $G(q^{-1})$ are assumed to have all zeros in $|z|<1$ due to the problem formulation, the filter (2.7) is guaranteed to be stable. The compensator will be causal, since the involved filters have only backward shift operators as arguments, and since βGN in (2.7) has a nonzero leading coefficient due to the fact that all involved polynomials are monic. This means that m(t) and its output signal u(t) will at time t not be a function of future values of w(t).

The optimal filter structure (2.7) and the corresponding design equations (2.8) and (2.9) can be derived by the orthogonality principle, see for example [19, 23, 24, 29]. All admissible alternative filters are then considered whereafter it is demonstrated that no alternative compensator could attain a lower criterion value than that attained by (2.7).

The polynomial spectral factorization equation (2.8) will always have a stable solution. When the complex variable z is substituted for the operator q, the right-hand side of (2.8) can be regarded as a polynomial with zeros distributed symmetrically inside and outside the unit circle $|z|=1$. No zeros can be located precisely on the unit circle, due to the stability assumptions on filters and models introduced above. The solution of the equation (2.8) corresponds to collecting the unique factor that includes all zeros inside the unit circle, which forms the polynomial $\beta(q^{-1})$. The scalar r is just a normalization factor to make $\beta(q^{-1})$ monic.

The polynomial Diophantine equation (2.9) can easily be converted into a system of linear equations, to be solved with respect to the polynomial coefficients of $Q(q^{-1})$ and L*(q). These equations are formed by setting coefficients of the same powers in q equal on the right- and left-hand sides of (2.9). Due to the general theory for solvability of polynomial Diophantine equations, see [25], the equation (2.9) can be guaranteed to have a unique solution. This is because the polynomials β*(z) and $A(z^{-1})N(z^{-1})H(z^1)z$ on the right-hand side can never have common factors. This is because β*(z) is the conjugated polynomial of $\beta(z^{-1})$, so it will have all its zeros outside $|z|=1$, while $A(z^{-1})$, $N(z^{-1})$ and $H(z^1)$ will due to the design assumptions have zeros only inside $|z|=1$.

Thus, the stated design problem can always be solved and the solution is embodied by the compensation filter expressions (2.4),(2.7) and the design equations (2.8) and (2.9). Linear time-invariant filters that minimize quadratic criteria based on second order (spectral) signal models are called Wiener filters in the literature. See e.g. [26]. The compensator design equations that for the filter (2.4) result in a minimization of the criterion (2.6) represent a novel result, not only in the domain of audio precompensation but in Wiener filter design and linear-quadratic design in general.

3. Multivariable Compensators Realized in State-Space Form, Designed by for Example Linear Quadratic Optimization The polynomial formalism and design of the above section can be generalized to MIMO (multiple input multiple output) filters and models, using polynomial matrix representations described in [27]. A MIMO design can also be performed by linear quadratic-Gaussian (LQG) optimization based on state space models and such a design will be outlined below. For a general introduction to LQG design based on state space methods, see e.g. [28].

In the following, conventional notations of dynamic systems in the field of state theory are used to describe a multichannel implementation of the precompensation filter of the present invention. Matrices whose elements are real-valued constants (not filters), are in the following represented by boldface and underlined symbols. A vector-ARMA model of w(t) is then introduced as a linear time-invariant state-space model in discrete time, with state vector $x_1(t)$ of appropriate dimension:

$$x_1(t+1)=\underline{F_1}x_1(t)+\underline{G_1}v(t) \tag{3.1}$$
$$w(t)=\underline{C_1}x_1(t)+\underline{D_1}v(t),$$

where w(t) is a column vector with dimension r, as in Section 1. The vector v(t) of dimension r represents white noise with known covariance matrix $\underline{R}_+$. The ARMA model (3.1) is assumed stable and stably invertible. In (3.1), $\underline{D}_+$ is assumed to be an invertible r×r matrix, which is normally set equal to the unit matrix. When w(t) is assumed white, the dimension of $x_1(t)$ is zero and $w(t)=\underline{D}_+v(t)$.

The stable linear design model H in (1.1) that describes the audio system to be compensated is realized in state space form, with state vector $x_2(t)$, as:

$$x_2(t+1) = \underline{F}_2 x_2(t) + \underline{G}_2 u(t) \quad (3.2)$$
$$y(t) = \underline{C}_2 x_2(t),$$

where the vector y(t) has dimension m while u(t) has dimension p. The bulk delay is assumed generated by the state delay structure. A larger delay will therefore increase the dimension of the state vector $x_2(t)$.

The stable desired system (1.2) is also realized in state space form, with state vector $x_3(t)$:

$$x_3(t+1) = \underline{F}_3 x_3(t) + \underline{G}_3 w(t) \quad (3.3)$$
$$y_{ref}(t) = \underline{C}_3 x_3(t),$$

where the bulk delay d is built into the state delay structure.

The compensator filter structure (1.7) is used, in which the stable pre-specified linear filter F is realized in state-space form, with state vector $x_4(t)$:

$$x_4(t+1) = \underline{F}_4 x_4(t) + \underline{G}_4 w(t) \quad (3.4)$$
$$u(t) = \underline{C}_4 x_4(t) + m(t).$$

The additive signal m(t) in (3.4) is to be optimized based on the criterion (1.6), here with V=I for simplicity. The stable input penalty filter W in the criterion is realized as yet another filter in state space form, with output signal vector denoted f(t):

$$x_5(t+1) = \underline{F}_5 x_5(t) + \underline{G}_5 m(t) \quad (3.5)$$
$$f(t) = \underline{C}_5 x_5(t).$$

The quadratic criterion (1.6) to be minimized is thus here given by:

$$J=E(|(y(t)-y_{ref}(t))|^2)+E(|f(t)|^2. \quad (3.6)$$

Now, define the total state vector of the system as:

$$x(t)=[x_1(t)^T x_2(t)^T x_3(t)^T x_4(t)^T x_5(t)^T]^T. \quad (3.7)$$

The state update equations in (3.1)–(3.5) may then be combined into a single model:

$$x(t+1) = \underline{F}x(t) + \underline{G}m(t) + \underline{H}v(t), \quad (3.8)$$

where the state transition matrix $\underline{F}$ and the input $\underline{G}$ and $\underline{H}$ of the joint model are easily obtained from the sub-models (3.1)–(3.5). The criterion (3.6) can then be expressed in the form of a criterion with infinite control horizon and penalty on selected states. We also add a penalty on a quadratic form in m(t) as a regularization term, with penalty matrix $\underline{R}$:

$$J = E(x(t)^T \underline{C}^T \underline{C}x(t) + x(t)^T \underline{M}^T \underline{M}x(t) + m(t)^T \underline{R}m(t)) = E(x(t)^T \underline{Q}x(t) + x(t)^T \underline{R}x(t)), \quad (3.9)$$

where $$\underline{C} = (0\underline{C}_2 - \underline{C}_3 00)$$
$$\underline{M} = (0000\underline{C}_5)$$
$$\underline{Q} = \underline{C}^T \underline{C} + \underline{M}^T \underline{M}.$$

If x(t) is known, a linear state feedback:

$$m(t) = \underline{L}x(t), \quad (3.10)$$

can be designed to minimize the infinite-horizon criterion (3.8). The optimal controller gain matrix is given by:

$$\underline{L} = (\underline{G}^T \underline{SG} + \underline{R})^{-1} \underline{G}^T \underline{SF}, \quad (3.11)$$

where $\underline{S}$ is the symmetric and positive semi-definite matrix that solves the algebraic matrix Riccati equation:

$$\underline{S} = \underline{F}^T \underline{SF} + \underline{Q} - \underline{F}^T \underline{SF}(\underline{G}^T \underline{SG} + \underline{R})^{-1} \underline{G}^T \underline{SF}. \quad (3.12)$$

Since all involved systems are stable, the total system is by definition detectable and stabilizable. This guarantees the existence of a solution to this linear quadratic state feedback control problem. This solution corresponds to a solution matrix $\underline{S}$ to (3.12) that is positive semi-definite. If $\underline{R}$ is set to a positive definite matrix, then the p×p matrix inverse appearing in (3.11) and (3.12) will always exist.

If the state vector is not known, it can be estimated by an observer. The separation principle of linear quadratic optimal control theory states that a jointly optimal design, that uses only measurable signals and that minimizes (3.9), is obtained if this observer is designed as a quadratically optimized linear observer, a Kalman estimator. Such a design is known as a Linear Quadratic Gaussian (LQG) design, or an $H_2$-optimal design. In the particular problem formulation considered here, an optimal state observer is simple to design. The stable subsystems (3.3)–(3.5) are driven by measurable signals only, without noise, and they are parts of the compensator and the problem formulation. Their states are therefore known. The output of the model (3.2) is not directly measurable, since the design is to be a feed-forward solution, that does not use feedback from the sound measurements $y_m(t)$. The best admissible observer for $x_2(t)$ is then just a replica of (3.2), driven by the known signal u(t), that provides state estimates $x_2(t|t-1)$.

In the model (3.1) $\underline{D}_1$ is assumed invertible, so the noise input v(t) can be estimated as:

$$v(t|t)=\underline{D}_1^{-1}(w(t)-\underline{C}_1 x_1(t|t-1)).$$

The state estimate for $x_1(t)$ can therefore be updated through:

$$x_1(t+1\mid t)=\underline{F}_1 x_1(t\mid t-1)+\underline{G}_1 v(t\mid t)=\left(\underline{F}_1-\underline{G}_1\underline{D}_1^{-1}\underline{C}_1\right)x_1(t\mid t-1)+\underline{G}_1\underline{D}_1^{-1}w(t). \quad (3.13)$$

This recursion will be stable, since the ARMA model (3.1) has been assumed to be stably invertible. The equation (3.13) is of course superfluous when w(t) is assumed white. The complete solution is thus given by equations (3.13), (3.2), (3.3), (3.5) for estimating the states and (3.4) representing the precompensator, with m(t) generated by:

$$m(t)=-\underline{L}x(t\mid t-1), \quad (3.14)$$

$$m(t)=-\underline{L}x(t|t-1), \quad (3.14)$$

where $$x(t|t-1)=[x_1(t|t-1)^T x_2(t|t-1)^T x_3(t)^T x_4(t)^T x_5(t)^T]^T. \quad (3.15)$$

The compensator (3.4), (3.14):

$$u(t)=\underline{C}_4 x_4(t)-\underline{L}x(t\mid t-1),$$

constitutes an IIR filter with r inputs w(t) and p outputs u(t). The gain matrix $\underline{L}$ is optimized by solving (3.12) for $\underline{S}$ with one of the many existing solvers for algebraic Riccati equations, and then using (3.11).

4. Nonlinear Models and Compensators

The design principles introduced in Section 1 can be generalized to audio precompensation problems in which the design model may be nonlinear and/or where the required compensator has a nonlinear structure. The simplest example of this is perhaps linear systems and compensators in series with nonlinear static elements, such as limiters.

Such elements will in practice always be present in a real system, but are ignored in the linear design and optimization. Other conceivable nonlinear model and filter structures include Volterra and Wiener models, neural networks, functional series expansions, and model structures that include nonlinear physics-based models of acoustic elements.

Define the sets of delayed signal vectors:

$$Y(t)=\{y(t),y(t-1),\ldots\}$$

$$U(t)=\{u(t),u(t-1),\ldots\}$$

$$W(t)=\{w(t),w(t-1),\ldots\}.$$

A nonlinear and possibly time-varying dynamic model corresponding to (1.1) may then be represented by:

$$y(t)=h(U(t),t)\ y_m(t)=y(t)+e(t), \quad (4.1)$$

where h( ) represents a possibly nonlinear and time-varying dynamic operator. Likewise, a possibly nonlinear desired response model, that generalizes the structure (1.2), is:

$$y_{ref}(t)=d(W(t),t), \quad (4.2)$$

where d( ) represents a possibly nonlinear and time-varying dynamic operator. A key property of the proposed invention, preserved also in the nonlinear case, is the additive decomposition of the precompensator. For nonlinear and possibly time-varying compensators, this is expressed in the form:

$$u(t)=r(W(t),t)=f(W(t),t)+m(t);\ f(t)\neq 0\, m(t)=c(W(t),t). \quad (4.3)$$

Here, r( ), f( ) and c( ) represent possibly nonlinear and time-dependent stable dynamic operators. The operator f is prespecified and is not identically zero, while c is to be tuned by optimization. It is preferred if the parameterization of c is such that c=0 is allowed by some parameter setting, so that a nominal response r=f can be obtained for that case. Also for nonlinear problems, the optimization criterion should include a weighting between the closeness of r to f (smallness of m(t)) and closeness of the compensated output y(t) to $y_{ref}(t)$. If this weighting is made frequency dependent, this should, as in the linear case, be represented by linear and stable dynamic weighting matrices V and W, since frequency properties are preserved in a meaningful way only by linear systems.

A criterion corresponding to (1.6) would for nonlinear systems be dependent on the input signal amplitudes. A scalar quadratic criterion that weights the response for a given deterministic input signal sequence w(t) may still be defined and minimized. A possible appropriate criterion is then of the form:

$$\Sigma_t(|V(y(t)-y_{ref}(t))|^2)+\Sigma_t(|Wm(t)|^2), \quad (4.4)$$

where $\Sigma_t(\ )$ denotes a sum over a specific test signal sequence w(t), with appropriate amplitude range. A minimization of (4.4) with respect to free parameters in c( ) in (4.3) may for nonlinear models and/or nonlinear filters be performed by a numerical search routine.

5. Implementational Aspects

Typically, the design equations are solved on a separate computer system to produce the filter parameters of the precompensation filter. The calculated filter parameters are then normally downloaded to a digital filter, for example realized by a digital signal processing system or similar computer system, which executes the actual filtering.

The filter design scheme proposed by the invention is thus preferably implemented as software in the form of program modules, functions or equivalent. The software may be written in any type of computer language, such as C, C++ or even specialized languages for digital signal processors (DSPs). In practice, the relevant steps, functions and actions of the invention are mapped into a computer program, which when being executed by the computer system effectuates the calculations associated with the design of the precompensation filter. In the case of a PC-based system, the computer program used for the design of the audio precompensation filter is normally encoded on a computer-readable medium such as a CD or similar structure for distribution to the user/filter designer, who then may load the program into his/her computer system for subsequent execution.

Figure 12:
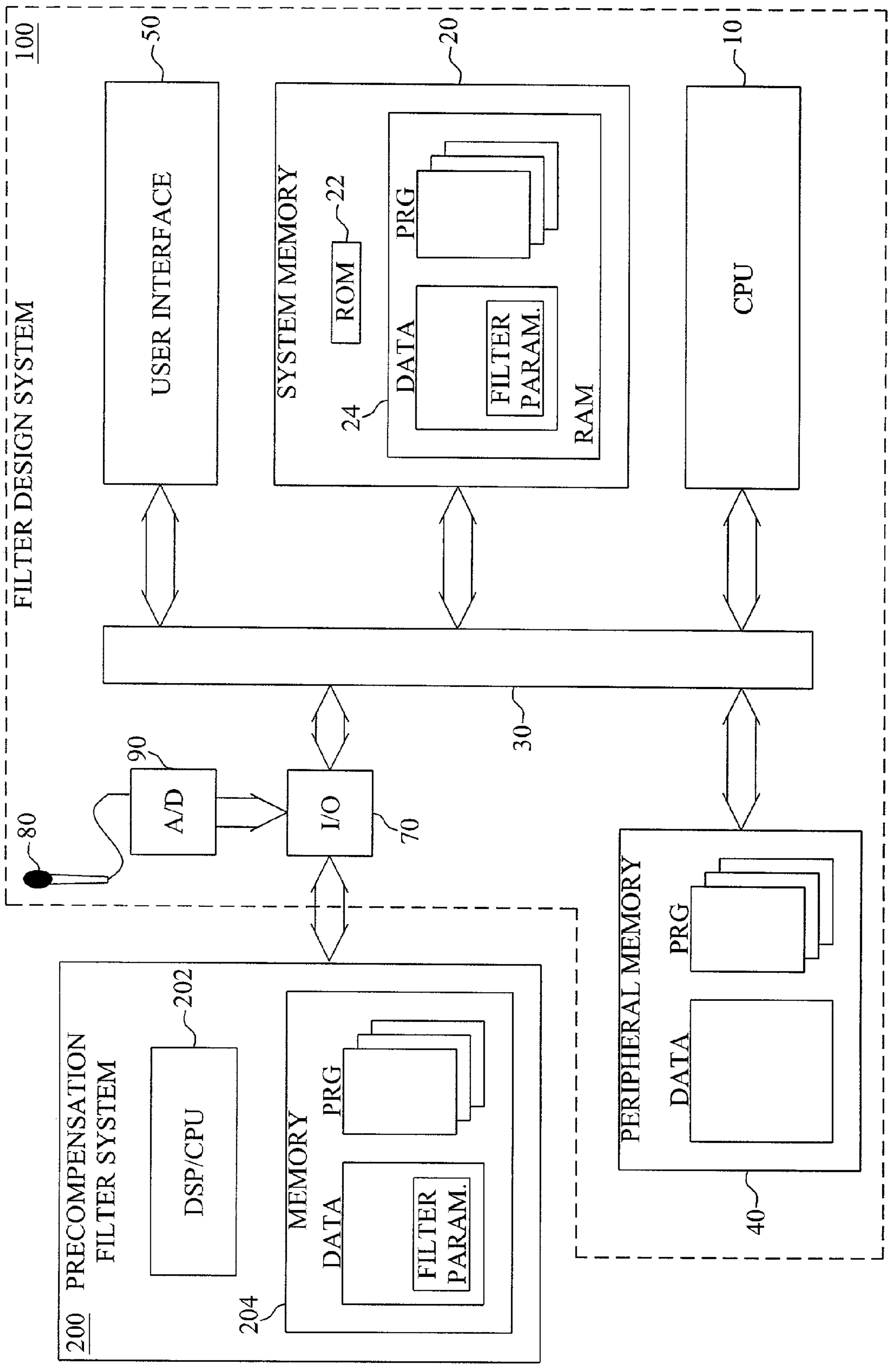
FIG. 12 is a block diagram of a computer-based system suitable for implementation of the invention.

FIG. 12 is a schematic block diagram illustrating an example of a computer system suitable for implementation of a filter design algorithm according to the invention. The system 100 may be realized in the form of any conventional computer system, including personal computers (PCs), mainframe computers, multiprocessor systems, network PCs, digital signal processors (DSPs), and the like. Anyway, the system 100 basically comprises a central processing unit (CPU) or digital signal processor (DSP) core 10, a system memory 20 and a system bus 30 that interconnects the various system components. The system memory 20 typically includes a read only memory (ROM) 22 and a random access memory (RAM) 24. Furthermore, the system 100 normally comprises one or more driver-controlled peripheral memory devices 40, such as hard disks, magnetic disks, optical disks, floppy disks, digital video disks or memory cards, providing non-volatile storage of data and program information. Each peripheral memory device 40 is normally associated with a memory drive for controlling the memory device as well as a drive interface (not illustrated) for connecting the memory device 40 to the system bus 30. A filter design program implementing a design algorithm according to the invention, possibly together with other relevant program modules, may be stored in the peripheral memory 40 and loaded into the RAM 22 of the system memory 20 for execution by the CPU 10. Given the relevant input data, such as a model representation, a fixed filter component, a configured weighting and a representation of the reference system, the filter design program calculates the filter parameters of the precompensation filter.

The determined filter parameters are then normally transferred from the RAM 24 in the system memory 20 via an I/O interface 70 of the system 100 to a precompensation filter system 200. Preferably, the precompensation filter system 200 is based on a digital signal processor (DSP) or similar central processing unit (CPU) 202, and one or more memory modules 204 for holding the filter parameters and the required delayed signal samples. The memory 204 normally also includes a filtering program, which when executed by the processor 202, performs the actual filtering based on the filter parameters.

Instead of transferring the calculated filter parameters directly to a precompensation filter system 200 via the I/O system 70, the filter parameters may be stored on a peripheral memory card or memory disk 40 for later distribution to a precompensation filter system, which may or may not be remotely located from the filter design system 100.

In order to enable measurements of sound produced by the audio equipment under consideration, any conventional microphone unit or similar recording equipment 80 may be connected to the computer system 100, typically via an analog-to-digital (A/D) converter 80. Based on measurements of conventional test signals made by the microphone 80 unit, the system 100 can develop a model of the audio system, using an application program loaded into the system memory 20. The measurements may also be used to evaluate the performance of the combined system of precompensation filter and audio equipment. If the designer is not satisfied with the resulting design, he may initiate a new optimization of the precompensation filter based on a modified set of design parameters.

Furthermore, the system 100 typically has a user interface 50 for allowing user-interaction with the filter designer. Several different user-interaction scenarios are possible.

For example, the filter designer may decide that he/she wants to use a specific, customized set of design parameters such as a specific fixed filter component and/or weighting in the calculation of the filter parameters of the filter system 200. The filter designer then defines the relevant design parameters such as a fixed filter component and/or weighting via the user interface 50.

It is also possible for the filter designer to select between a set of different pre-configured fixed, filter components and/or weightings, which may have been designed for different audio systems, listening environments and/or for the purpose of introducing special characteristics into the resulting sound. In such a case, the preconfigured options are normally stored in the peripheral memory 40 and loaded into the system memory during execution of the filter design program. By testing several preconfigured options and/or by modifying parameters in a pre-configured option, the filter designer may then select a fixed, non-zero filter component and/or weighting that is best adapted for the present audio system and listening environment.

Alternatively, the filter design program more or less automatically selects a default fixed, non-zero filter component and weighting, possibly based on the audio equipment with which the precompensation filter is to be used.

In addition to the fixed, non-zero filter component and the frequency- and/or channel-dependent weighting, the filter designer may also define the reference system by using the user interface 50. For example, the delay of the reference system may be selected by the user, or provided as a default delay. More advanced special effects may be introduced by careful selection of reference system. Such special effects might include obtaining cinema sound reproduction with a compact stereo system.

Instead of determining a system model based on microphone measurements, it is also possible for the filter designer to select a model of the audio system from a set of different reconfigured system models. Preferably, such a selection is based on the particular audio equipment with which the resulting precompensation filter is to be used.

In an alternative implementation, the filter design is performed more or less autonomously with no or only marginal user participation. An example of such a construction will now be described. The exemplary system comprises a supervisory program, system identification software and filter design software. The supervisory program first generates test signals and measures the resulting acoustic response of the audio system. Based on the test signals and the obtained measurements, the system identification software determines a model of the audio system. The supervisory program then gathers and/or generates the required design parameters and forwards these design parameters to the filter design program, which calculates the precompensation filter parameters. The supervisory program may then, as an option, evaluate the performance of the resulting design on the measured signal and, if necessary, order the filter design program to determine a new set of filter parameters based on a modified set of design parameters. This procedure may be repeated until a satisfactory result is obtained. Then, the final set of filter parameters are downloaded to the precompensation filter system.

It is also possible to adjust the filter parameters of the precompensation filter adaptively, instead of using a fixed set of filter parameters. During the use of the filter in an audio system, the audio conditions may change. For example, the position of the loudspeakers and/or objects such as furniture in the listening environment may change, which in turn may affect the room acoustics, and/or some equipment in the audio system may be exchanged by some other equipment leading to different characteristics of the overall audio system. In such a case, continuous or intermittent measurements of the sound from the audio system in one or several positions in the listening environment may be performed by one or more microphone units or similar sound recording equipment. The recorded sound data may then be fed into a filter design system, such as system 100 of FIG. 12, which calculates a new audio system model and adjusts the filter parameters so that they are better adapted for the new audio conditions.

Naturally, the invention is not limited to the arrangement of FIG. 12. As an alternative, the design of the precompensation filter and the actual implementation of the filter may both be performed in one and the same computer system 100 or 200. This generally means that the filter design program and the filtering program are implemented and executed on the same DSP or microprocessor system.

Figure 13:
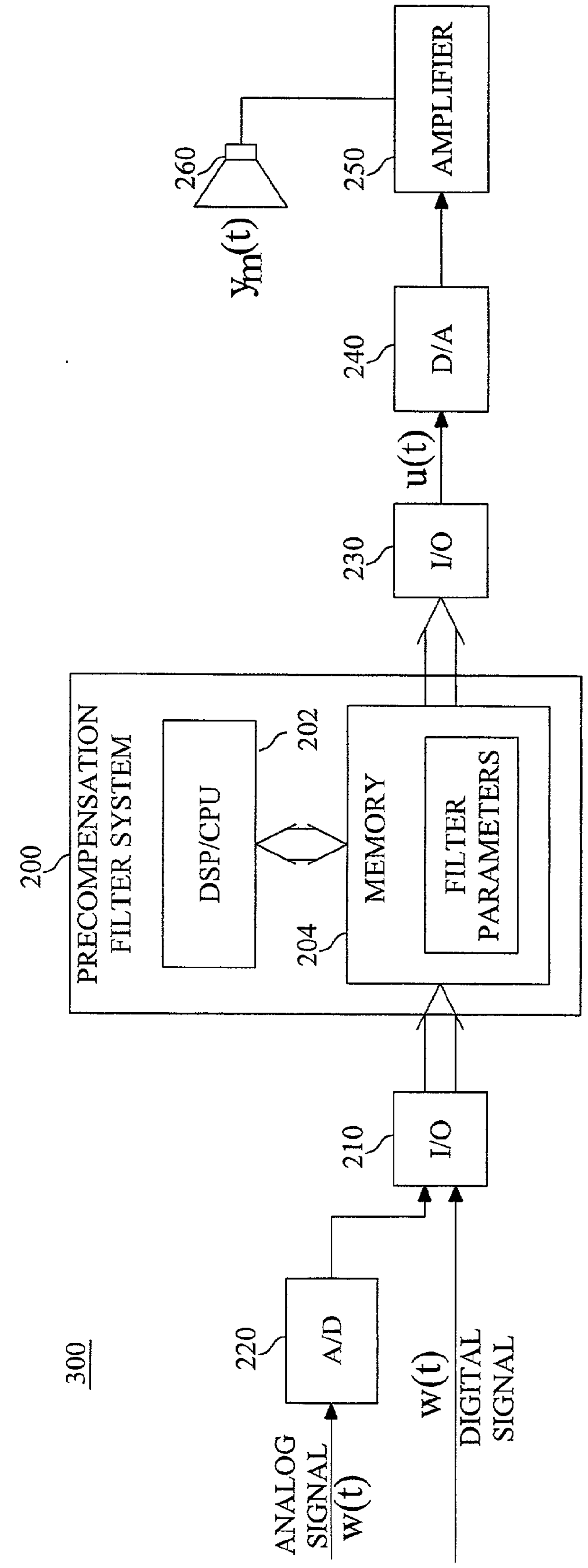
FIG. 13 illustrates an audio system incorporating a precompensation filter configured according to the design method of the invention.

A sound generating or reproducing system 300 incorporating a precompensation filter system 200 according to the present invention is schematically illustrated in FIG. 13. An audio signal w(t) from a sound source is forwarded to a precompensation filter system 200, possibly via a conventional I/O interface 210. If the audio signal w(t) is analog, such as for LPs, analog audio cassette tapes and other analog sound sources, the signal is first digitized in an A/D converter 210 before entering the filter 200. Digital audio signals from e.g. CDs, DAT tapes, DVDs, mini discs, and so forth may be forwarded directly to the filter 200 without any conversion.

The digital or digitized input signal w(t) is then precompensated by the precompensation filter 200, basically to take the effects of the subsequent audio system equipment into account. The compensation of the digital audio signal varies depending on the frequency- and/or channel dependent penalty term, which penalizes the compensating part of the filter system.

The resulting compensated signal u(t) is then forwarded, possibly through a further I/O unit 230, to a D/A-converter 240, in which the digital compensated signal u(t) is converted to a corresponding analog signal. This analog signal then enters an amplifier 250 and a loudspeaker 260. The sound signal $y_m(t)$ emanating from the loudspeaker 260 then has the desired audio characteristics, giving a close to ideal sound experience. This means that any unwanted effects of the audio system equipment have been eliminated through the inverting action of the precompensation filter, without over-compensating the system. As mentioned above, extra sound effects may also be introduced in the resulting sound signal $y_m(t)$.

The precompensation filter system may be realized as a stand-alone equipment in a digital signal processor or computer that has an analog or digital interface to the subsequent amplifiers, as mentioned above. Alternatively, it may be integrated into the construction of a digital preamplifier, a computer sound card, a compact stereo system, a home cinema system, a computer game console or any other device or system aimed at producing sound. It is also possible to realize the precompensation filter in a more hardware-oriented manner, with customized computational hardware structures.

It should be understood that the precompensation may be performed separate from the distribution of the sound signal to the actual place of reproduction. The precompensation signal generated by the precompensation filter does not necessarily have to be distributed immediately to and in direct connection with the sound generating system, but may be recorded on a separate medium for later distribution to the sound generating system. The compensation signal u(t) in FIG., 1 could then represent for example recorded music on a CD or DVD disk that has been adjusted to a particular audio equipment and listening environment. It can also be a precompensated audio file stored on an Internet server for allowing subsequent downloading of the file to a remote location over the Internet.

Figure 14:
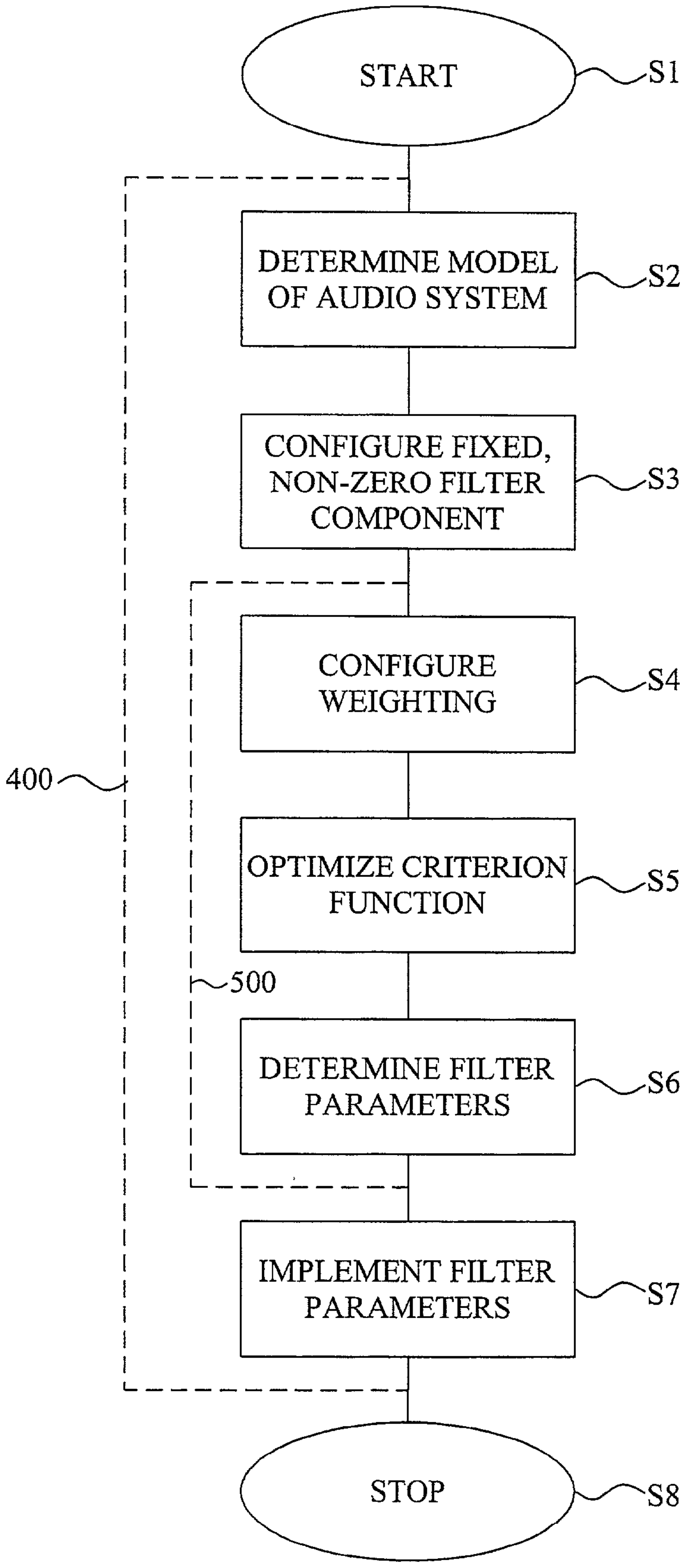
FIG. 14 is a flow diagram illustrating the overall flow of a filter design method according to an exemplary embodiment of the invention.

Finally, the overall flow of a filter design method according to an exemplary embodiment of the invention will now be summarized with reference to the flow diagram of FIG. 14. This flow diagram not only illustrates the actual design steps, but also pre-steps that are preferably used together with the present invention, and hence represents an example of the general steps of designing a precompensation filter of the invention, starting from an uncompensated audio system and ending with an implemented filter.

The overall design method starts in step S1. In step S2, a model of the audio system is determined based on methods well-known for a person skilled in the art, e.g. by determining the model based on physical laws or by conducting measurements on the audio system using known test signals. A fixed, non-zero filter component is then configured in step S3. This configuration may be performed e.g. by using a default pre-configured filter component, by selecting a filter component from a set of pre-configured filter components or by inputting a user-specified, customized fixed filter component. In step S4, a weighting is configured. This is a weighting between, on one hand, approximating the precompensation filter to the fixed filter component and, on the other hand, approximating the precompensated model response to a reference system response. This configuration could, in the same way as for the filter component, be performed e.g. by using a default pre-configured weighting, by selecting a weighting from a set of weightings or by inputting a completely novel weighting. In step S5, which represents a preferred embodiment of the invention, a criterion function including the weighting configured in step S4 is optimized with respect to an adjustable compensator component. This optimization gives the adjustable compensator component, which together with the fixed, non-zero filter component is used for determining the filter parameters of the precompensation filter in step S6. In step S7, the determined filter parameters are then implemented into filter hardware or software of the precompensation filter.

If required, the filter parameters may have to be adjusted. The overall design method may then be repeated, schematically represented by the dashed line 400, or certain steps may be repeated as represented by the dashed line 500.

The embodiments described above are merely given as examples, and it should be understood that the present invention is not limited thereto. Further modifications, changes and improvements that retain the basic underlying principles disclosed and claimed herein are within the scope and the spirit of the invention.

REFERENCES

[1] U.S. Pat. No. 4,739,513

[2] U.S. Pat. No. 5,384,856

[3] U.S. Pat. No. 5,627,899

[4] Clarkson, P. M., J. Mourjopoulos and J. K. Hammond (1985) "Spectral phase and transient equalization for audio systems", *J. Audio Engineering Society*, vol. 33, pp. 127–131.

[5] Nelson, P. A., H. Hamada and S. J. Elliot (1992) "Adaptive inverse filtering for stereophonic sound reproduction", *IEEE Transactions on Signal Processing*, vol. 40, pp. 1621–1632.

[6] Nelson P. A., F. Ordua-Bustamante (1996) "Multichannel signal processing techniques in the reproduction of sound", *J. Audio Engineering Society*, vol. 44, pp. 973–989.

[7] Nelson P. A., F. Ordua-Bustamante and H. Hamada (1995) "Inverse filter design and equalization zones in multichannel sound reproduction systems", *IEEE Transactions on Speech and Audio Processing*, vol.3, pp. 185–192.

[8] U.S. Pat. No. 4,683,590

[9] U.S. Pat. No. 5,727,066

[10] International Patent Application WO 94/24835

[11] U.S. Pat. No. 5,438,625

[12] U.S. Pat. No. 5,511,129

[13] Japanese patent application 08-0799880

[14] Widrow B and S. D. Steams (1985) *Adaptive Signal Processing*. Prentice-Hall.

[15] Haykin, S (1996), *Adaptive Filter Theory* 3rd ed. Prentice-Hall, Englewood Cliffs, N.J.

[16] Neely S. T. and J. B. Allen (1979) "Invertibility of a room impulse response", *J. Acoustical Society of America*, vol. 66 pp. 165–169.

[17] Sternad, M, M. Johansson and J. Rutström (2000) "Inversion of loudspeaker dynamics by polynomial LQ feedforward control", *IFAC Symposium on Robust Control Design*, Prague, Czech Republic, Jun. 21–23, 2000.

[18] Sternad M. and T. Söderström (1988) "LQG-optimal feedforward regulators", *Automatica*, vol.24, pp. 557–561.

[19] Sternad, M. and A. Ahlen (1993b) "LQ control and self-tuning control", Chapter 3 of K. E. Hunt, ed. *Polynomial Methods in Optimal Control and Filtering*, Control Engineering Series, Peter Peregrinus, London.

[20] Strube, H. W. (1980) "Linear prediction on a warped frequency scale", *J. Acoustical Society of America*, vol. 68 pp. 1071–1076.

[21] Francis, B. A (1987) *A Course in $H_\infty$ Control Theory*. Springer-Verlag, Berlin.

[22] Vidyasagar, M (1985) *Control System Synthesis. A Factorization Approach*. MIT Press, Cambridge, Mass.

[23] Åström K. J. and B. Wittenmark (1997) *Computer-Controlled Systems*, 3rd ed Prentice-Hall, Englewood Cliffs, N.J.

[24] Ahlen A. and M. Sternad (1991) "Wiener filter design using polynomial equations", *IEEE Transactions on Signal Processing*, vol.39, pp. 2387–2399.

[25] Kucera V. (1991) *Analysis and Design of Linear Control Systems*, Academia, Prague and Prentice-Hall International, London.

[26] Bode, H. W. and C. E. Shannon (1950) "A simplified derivation of linear least squares smoothing and prediction theory", *Proceedings of the I.R.E.*, vol. 38, pp. 417–425.

[27] Ahlen A. and M. Sternad (1994) "Derivation and design of Wiener filters using polynomial equations", in C. T. Lenondes ed. *Control and Dynamic Systems. Digital Signal Processing and Applications*. Academic Press, New York.

[28] Anderson, B. D. O and J. B. Moore (1989) *Optimal Control. Linear Quadratic Methods*. Prentice-Hall International, London.

[29] Sternad M. and A. Ahlen (1993a) "A novel derivation methodology for polynomial LQ controller design", *IEEE Transactions on Automatic Control*, vol. 38, pp. 116–121.

What is claimed is:

1. A method for designing and creating an audio precompensation filter based on a model of the response of an associated sound generating system, wherein said audio precompensation filter, for design calculations, is additively decomposed into a fixed, non-zero filter component and an adjustable compensator component, and said method comprises the steps of:

determining said model of the response of said associated sound generating system based on measurements of sound, said sound being produced by said sound generating system;

determining said adjustable compensator component of said audio precompensation filter by optimizing a criterion function including a given weighting of both of:

i) approximating the audio precompensation filter to said fixed, non-zero filter component, and ii) approximating a precompensated model response to a reference system response;

determining filter parameters of said audio precompensation filter based on adding said fixed filter component and said determined compensator component; and creating said audio precompensation filter implementing said determined filter parameters, said audio precompensation filter being embodied together with said associated sound generating system so as to enable generation of sound influenced by said audio precompensation filter.

2. The method according to claim 1, further comprising the steps of configuring said fixed filter component and configuring said weighting.

3. The system according to claim 1, wherein said fixed filter component includes a by-pass component with at least one selectable delay element.

4. The method according to claim 1, wherein said model of the response of the sound generating system is a linear dynamic model and said audio precompensation filter is a linear dynamic filter.

5. The method according to claim 1, wherein said weighting includes at least one of frequency-dependent weighting and channel-dependent weighting.

6. The method according to claim 1, wherein said weighting includes a frequency-dependent weighting function.

7. The method according to claim 6, wherein said frequency-dependent weighting function is configured to enable different degrees of compensation in different frequency regions within the frequency range described by said model.

8. The method according to claim 6, wherein said frequency-dependent weighting function is configured such that the compensated model response approximates the reference system response in a set of user-specified frequency ranges, while the compensated model response approximates the by-passed model response in another set of user-specified frequency ranges.

9. The method according to claim 8, wherein the degree of approximation is measured by any appropriate norm for dynamic systems.

10. The method according to claim 1, wherein said sound generating system is a multi-channel system, and said precompensation filter includes multiple filters.

11. The method according to claim 10, wherein said weighting includes a channel-dependent weighting function.

12. The method according to claim 11, wherein said channel-dependent weighting function is configured to enable different types of compensation in different channels of said multichannel system.

13. The method according to claim 1, wherein said step of optimizing said criterion function is performed on-line by using recursive optimization or adaptive filtering.

14. The method according to claim 1, wherein said step of optimizing said criterion function is performed as a model-based off-line design.

15. The method according to claim 1, wherein said step of determining said compensator component comprises the step of minimizing said weighted criterion function with respect to adjustable filter parameters in said compensator component.

16. The method according to claim 15, wherein said criterion function is defined as:

$$J=E|V(HR-D)w(t)|^2+E|WCw(t)|^2,$$

where H is a representation of said model, R is a representation of said audio precompensation filter, D is a representation of said reference system, C is a representation of said adjustable compensator component, W is a weighting function representing said weighting, and V is a further optional weighting function, both of said weighting functions being linear and stable transfer function matrices, w(t) is an input signal to said precompensation filter, and E( ) denotes the expectation with respect to said input signal w(t).

17. The method according to claim 16, wherein said audio precompensation filter is implemented as a state-space realization of a stable IIR filter, and is based on the minimization of said criterion function by linear quadratic state-space tools.

18. The method according to claim 16, wherein said audio precompensation filter is implemented in the form of a stable IIR Wiener filter, where the fixed, non-zero by-pass component, represented by F, is configured as an FIR filter so that:

$$F(q^{-1})=q^{-d+k}F(q^{-1}),$$

where $q^{-x}$ is the standard backward shift operator with x steps, while $q^{x}$ is the standard forward shift operator with x steps and said adjustable compensator component C is a stable recursive filter defined as:

$$\beta(q^{-1})N(q^{-1})G(q^{-1})C(q^{-1})=Q(q^{-1})V(q^{-1}),$$

where the polynomial $Q(q^{-1})$ is, together with an anti-causal FIR filter L*(q), given by the unique solution to the linear scalar Diophantine polynomial equation:

$$z^{-d+k}[D(q^{-1})A(q^{-1})-F(q^{-1})B(q^{-1})N(q^{-1})]G(q^{-1})V^*(q)B^*(q)=Q(q^{-1})r\beta^*(q)-A(q^{-1})N(q^{-1})H(q^{-1})qL^*(q),$$

while the monic polynomial $\beta(q^{-1})$ is, together with a scalar r, given by the unique stable solution to the polynomial spectral factorization:

$$r\beta(q^{-1})\beta^*(q)=V(q^{-1})V^*(q)B(q^{-1})B^*(q)+W(q^{-1})W^*(q)A(q^{-1})A^*(q),$$

where A, B, G, L, N are auxiliary polynomials.

19. The method according to claim 1, wherein said model of the response of the sound generating system is a non-linear dynamic model and said audio precompensation filter is a non-linear dynamic filter.

20. A system for designing and creating an audio precompensation filter based on a model of the response of an associated sound generating system, wherein said audio precompensation filter, for design calculations, is additively decomposed into a fixed, non-zero filter component and an adjustable compensator component, and said system comprises:

means for determining said model of the response of said associated sound generating system based on measurements of sound, said sound being produced by said sound generating system;

means for determining said adjustable compensator component of said audio precompensation filter by optimization of a criterion function based on a given weighting of both of:

i) approximating the audio precompensation filter to said fixed, nonzero filter component, and ii) approximating a precompensated model response to a reference system response;

means for determining filter parameters of said audio precompensation filter based on adding said fixed filter component and said determined compensator component; and means for creating said precompensation filter implementing said determined filter parameters, said audio precompensation filter being embodied together with said associated sound generating system so as to enable generation of sound influenced by said audio precompensation filter.

21. The system according to claim 20, further comprising means for configuring said fixed filter component and means for configuring said weighting.

22. The system according to claim 20, wherein said fixed filter component includes a by-pass component with at least one selectable delay element.

23. The system according to claim 20, wherein said model of the response of the sound generating system is a linear dynamic model and said audio precompensation filter is a linear dynamic filter.

24. The system according to claim 20, wherein said weighting includes at least one of frequency-dependent weighting and channel-dependent weighting.

25. The system according to claim 20, wherein said weighting includes a frequency-dependent weighting function.

26. The system according to claim 25, wherein said frequency-dependent weighting function is configured to enable different degrees of compensation in different frequency regions within the frequency range described by said model.

27. The system according to claim 25, wherein said frequency-dependent weighting function is configured such that the compensated model response approximates the reference system response in a set of user-specified frequency ranges, while the compensated model response approximates the by-passed model response in another set of user-specified frequency ranges.

28. The system according to claim 27, wherein the degree of approximation is measured by any appropriate norm for dynamic systems.

29. The system according to claim 20, wherein said sound generating system is a multi-channel system, and said audio precompensation filter includes multiple filters.

30. The system according to claim 29, wherein said weighting includes a channel-dependent weighting function.

31. The system according to claim 30, wherein said channel-dependent weighting function is configured to enable different types of compensation in different channels of said multi-channel system.

32. The system according to claim 20, wherein said optimization of said criterion function is performed on-line by means of recursive optimization or adaptive filtering.

33. The system according to claim 20, wherein said optimization of said criterion function is performed as a model-based off-line design.

34. The system according claim 20, wherein said means for determining said compensator component comprises means for minimizing said weighted criterion function with respect to adjustable filter parameters in said compensator component.

35. The system according to claim 34, wherein said criterion function is defined as:

$$J=E|V(HR-D)w(t)|^2+E|WCw(t)|^2,$$

where H is a representation of said model, R is a representation of said audio precompensation filter, D is a representation of said reference system, C is a representation of said adjustable compensator component, W is a weighting function representing said weighting, and V is a further optional weighting function, both of said weighting functions being linear and stable transfer function matrices, w(t) is an input signal to said precompensation filter, and E( ) denotes the expectation with respect to said input signal w(t).

36. The system according to claim 35, wherein said audio precompensation filter is implemented as a state-space realization of a stable IIR filter, and is based on the minimization of said criterion function by linear quadratic state-space tools.

37. The system according to claim 35, wherein said audio precompensation filter is implemented in the form of a stable IIR Wiener filter, where the fixed, non-zero bypass component, represented by F, is configured as an FIR filter so that:

$$F(q^{-1})=q^{-d+k}F(q^{-1}),$$

where $q^{-x}$ is the standard backward shift operator with x steps, while $q^{x}$ is the standard forward shift operator with x steps, and said adjustable compensator component C is a stable recursive filter defined as:

$$\beta(q^{-1})N(q^{-1})G(q^{-1})C(q^{-1})=Q(q^{-1})V(q^{-1}),$$

where the polynomial $Q(q^{-1})$ is, together with an anti-causal FIR filter $L^*(q)$, given by the unique solution to the linear scalar Diophantine polynomial equation:

$$z^{-d+k}[D(q^{-1})A(q^{-1})-F(q^{-1})B(q^{-1})N(q^{-1})]G(q^{-1})V^*(q)B^*(q)=Q(q^{-1})r\beta^*(q)-A(q^{-1})N(q^{-1})H(q^{-1})qL^*(q)$$

while the monic polynomial $\beta(q^{-1})$ is, together with a scalar r, given by the unique stable solution to the polynomial spectral factorization:

$$r\beta(q^{-1})\beta^*(q)=V(q^{-1})V^*(q)B(q^{-1})B^*(q)+W(q^{-1})W^*(q)A(q^{-1})A^*(q),$$

where A, B, C, L, N are auxiliary polynomials.

38. The system according to claim 20, wherein said model of the response of the sound generating system is a nonlinear dynamic model and said audio precompensation filter is a non-linear dynamic filter.

39. An audio precompensation filter designed by using the method according to claim 1.

40. An audio system comprising a sound generating system and an audio precompensation filter in the input path to said sound generating system, wherein said audio precompensation filter is designed by using the method according to claim 1.

* * * * *